United States Patent [19]

Shiraishi

[11] Patent Number: 5,604,356

[45] Date of Patent: Feb. 18, 1997

[54] SUPERLATTICE OHMIC CONTACT ON A COMPOUND SEMICONDUCTOR LAYER

[75] Inventor: Yasushi Shiraishi, Tokyo, Japan

[73] Assignee: NEC Corporation, Tokyo, Japan

[21] Appl. No.: 498,234

[22] Filed: Jul. 5, 1995

Related U.S. Application Data

[63] Continuation of Ser. No. 53,571, Apr. 28, 1993, abandoned.

[30] Foreign Application Priority Data

Apr. 28, 1992 [JP] Japan .................................. 4-109500

[51] Int. Cl.$^6$ .................................................. H01L 29/15
[52] U.S. Cl. .............................. 257/17; 257/22; 257/25; 257/191
[58] Field of Search .................................. 257/22, 17, 18, 257/25, 191

[56] References Cited

U.S. PATENT DOCUMENTS

| | | | |
|---|---|---|---|
| 4,620,206 | 10/1986 | Ohta et al. ................................ | 257/17 |
| 4,797,716 | 1/1989 | Chaffin et al. ............................ | 257/18 |
| 4,801,984 | 1/1989 | Woodall .................................... | 257/744 |
| 4,914,488 | 4/1990 | Yamane et al. ............................ | 257/17 |
| 5,031,005 | 7/1991 | Futatsugi et al. ......................... | 257/25 |

FOREIGN PATENT DOCUMENTS 3-286526   12/1991   Japan .

Primary Examiner—Jerome Jackson, Jr.
Assistant Examiner—John Guay
Attorney, Agent, or Firm—Sughrue, Mion, Zinn, Macpeak & Seas

[57] ABSTRACT

The present invention provides an ohmic contact device which comprises: a first layer made of a first compound semiconductor having a first energy band gap; a superlattice in contact with the first layer, the superlattice having modulation-periods comprising alternating a first very thin layer made of the first compound semiconductor and a second very thin layer made of a second compound semiconductor having a second energy band gap being smaller than the first energy band gap, thicknesses of the first very thin layers being gradually reduced from an interface of the first layer to an opposite interface and thicknesses of the second very thin layers are gradually increased from the interface of the first layer to the opposite interface; a second layer made of the second compound semiconductor in contact with the superlattice; and a metal contact in contact with the second layer.

3 Claims, 12 Drawing Sheets

SUPERLATTICE OHMIC CONTACT ON A COMPOUND SEMICONDUCTOR LAYER

This is a Continuation of application Ser. No. 08/053,571 filed Apr. 28, 1993 now abandoned.

BACKGROUND OF THE INVENTION

The invention relates to an ohmic contact on a compound semiconductor layer, and more particularly to a non-alloyed ohmic contact having a super-lattice structure for a compound semiconductor device.

It is well known that parasitic resistances deteriorate the overall performances of semiconductor devices. One of the important causes of the parasitic resistances is the contact resistance such as a Schottky barrier which appears at the metal-semiconductor interface. The reduction of the potential barrier height is important to allow semiconductor devices exhibit such excellent performances as high speed and high frequency performances, particularly for submicron devices which utilize excellent properties of heterostructures such as HEMT (high electron mobility transistor) and HBT (heterojunction bipolar transistor). The scaling down of the device are being on the increase for an improvement in the performance and a high density of the integrated circuits. The importance and requirement of the reduction of the potential barrier or the contact resistance at the metal-semiconductor interface are on the increase, as both the scaling down of the device and thus the reduction of the device dimension and the improvements in the high speed and high frequency performances are increasingly required. Ohmic contacts are well known as an ideal contact free of the potential barrier and thus the metal-semiconductor contact resistance. Alloyed ohmic contacts have problems in the vertical and lateral diffusion of contact metal due to a high temperature processing. As the scaling down of the device is improved, such problems with the alloyed ohmic contacts are more considerable. That is why non-alloyed ohmic contacts tends to take an extremely important role. Some types of non-alloyed ohmic contacts on the compound semiconductor layer have been proposed. Typical non-alloyed ohmic contacts on the compound semiconductor layer such as GaAs layer will be described as the prior art.

Low resistance non-alloyed ohmic contacts on an n-type GaAs layer are disclosed in Journal of Vacuum Science and Technology, 1981, Vol. 19. pp. 626–627, "Ohmic contacts to n-GaAs using graded band gap layers of $Ga_{1-x}In_xAs$ gown by molecular beam epitaxy" J. M. Woodall et. al. The structure and property of the non-alloyed ohmic contacts will be described with reference to FIG. 1.

FIG. 1 is a diagram illustrative of energy bands of the low resistance non-alloyed ohmic contacts on n-type GaAs layer. A layer 2 of GaAs doped with an n-type dopant is deposited on a substrate which is not illustrated. An epitaxial layer 6 of n-type $Ga_{1-x}In_xAs$ is grown by molecular beam epitaxy on the n-type GaAs layer 2. The n-type $Ga_{1-x}In_xAs$ layer 6 is graded in composition from x=0 at the GaAs interface to $0.8 \leq x \leq 1$ at opposite interface. A layer 4 of InAs doped with n-type dopant is formed on the n-type $Ga_{1-x}In_xAs$ graded layer 6. A metal contact 5 is formed on the n-type InAs layer 4. From FIG. 1, it is understood that the conduction band profile of the contact across the interfaces of the above layers has no discontinuity nor potential barrier at each of the interfaces of the above layers. Such desirable conduction band profile being free of any discontinuity or potential barrier at the interfaces between the above layers is due to the existence of the n-type $Ga_{1-x}In_xAs$ graded layer 6. This results in a nearly zero Schottky barrier height at the interfaces between the metal contact 5 and the n-type $Ga_{1-x}In_xAs$ graded layer 4 Thus, such non-alloyed low resistance ohmic contact to the n-type GaAs layer is obtained.

Further, another type of low resistance non-alloyed ohmic contacts on an n-type GaAs layer is disclosed in Applied Physics Letters, Vol. 53, pp–900, 1988, "Extremely low resistance non-alloyed ohmic contacts on n-type GaAs using InAs/InGaAs and InAs/GaAs strained-layer superlattices", C. K. Peng, at. al. The structure and property of the non-alloyed ohmic contacts will be described with reference to FIG. 2.

FIG. 2 is a diagram illustrative of energy bands of the low resistance non-alloyed ohmic contacts on n-type GaAs layer. A short-period n-type GaAs/InAs strained-layer superlattice 7 is grown by molecular beam epitaxy on a n-type GaAs layer 2. A layer 4 of n-type InAs is formed on the n-type GaAs/InAs strained-layer superlattice 7. A metal contact 5 is formed on the n-type InaAs layer 4.

The strained-layer superlattice 7 comprises alternating n-type GaAs and n-type InAs layers. Each InAs layer forms a quantum well and each GaAs layer forms potential barrier. Electrons serving as carriers are confined in the periodical potential wells in the conduction band. In the superlattice, the thickness of the each GaAs layer and thus the width of the potential barrier is so thin that the resonant tunneling of electrons through the potential barrier occurs. Electron currents mainly due to the resonant tunneling flow across the interfaces of the superlattice structure. The electrons exhibiting the resonant tunneling across the superlattice structure experience nearly zero potential barrier thereby a low resistance ohmic contact is obtained.

Another type of low resistance non-alloyed ohmic contacts on a p-type GaAs layer is disclosed in Electronics Letters 16th Aug. 1990 Vol. 26, No. 17, "Very low resistivity ohmic contact to p-type GaAs using $In_xGa_{1-x}As$ interlayer", P. L. Janega at al. The structure and property of the non-alloyed ohmic contacts will be described with reference to FIG. 3.

FIG. 3 is a diagram illustrative of energy bands of the low resistance non-alloyed ohmic contacts on p-type GaAs layer. A layer 2' of GaAs doped with a p-type dopant is deposited on a substrate which is not illustrated. An epitaxial layer 6' of p-type $Ga_{1-x}In_xAs$ is grown by molecular beam epitaxy on the p-type GaAs layer 2'. The p-type $Ga_{1-x}In_xAs$ layer 6' is graded in composition from x=0.07 at the GaAs interface to 0.5 at opposite interface. A layer 4' of InAs doped with p-type dopant is formed on the p-type $Ga_{1-x}In_xAs$ graded layer 6'. The doping level of the p-type InAs layer is $1 \times 10^{19}$ atom/cm$^{-3}$. A metal contact 5 is formed on the n-type InAs layer 4. From FIG. 3, it is understood that the valence band profile across the interfaces of the above layers has no discontinuity nor potential barrier at each of the interfaces of the above layers. Holes serving as carriers across the interfaces of the layers experience a nearly zero potential barrier. Such desirable conduction band profile being free of any discontinuity or potential barrier at the interfaces between the above layers is due to the existence of the p-type $Ga_{1-x}In_xAs$ graded layer 6'. This results in a 0.4 eV to 0.5 eV of the Schottky barrier height at the interfaces between the metal contact 5 and the p-type InAs layer 4'. Thus, such non-alloyed low resistance ohmic contact to the p-type GaAs layer is obtained.

Further, another type of low resistance non-alloyed ohmic contacts on a p-type GaAs layer has been known. The structure and property of the non-alloyed ohmic contacts will be described with reference to FIG. 4.

FIG. 4 is a diagram illustrative of energy bands of the low resistance non-alloyed ohmic contacts on p-type GaAs layer. A short-period p-type GaAs/InAs strained-layer superlattice 7' is grown by molecular beam epitaxy on a p-type GaAs layer 2'. A layer 4' of p-type InAs is formed on the p-type GaAs/InAs strained-layer superlattice 7'. A metal contact 5 is formed on the p-type InAs layer 4'.

The strained-layer superlattice 7' comprises alternating p-type GaAs and p-type InAs layers. Each InAs layer forms a quantum well and each GaAs layer forms potential barrier. Holes serving as carriers are confined in the periodical potential wells in the valence band. In the superlattice structure 7', the thickness of the each GaAs layer and thus the width of the potential barrier is so thin that the resonant tunneling of holes through the potential barrier occurs. Hole currents mainly due to the resonant tunneling flow across the interfaces of the superlattice structure. The holes exhibiting the resonant tunneling across the superlattice structure experience nearly zero potential barrier thereby a low resistance ohmic contact is obtained.

Another type of low resistance non-alloyed ohmic contacts on a p-type GaAs layer is disclosed in IEEE Electron Devices Letters 1987 Vol. 8, No. 30, "An(Al,Ga)As/GaAs Heterostructure Bipolar Transistor with Nonalloyed Graded-Gap Ohmic Contacts to the Base and Emitter", M. A. Rao at al. The structure and property of the non-alloyed ohmic contacts will be described with reference to FIG. 5.

FIG. 5 is a diagram illustrative of energy bands of the low resistance non-alloyed ohmic contacts on p-type GaAs layer. A layer 2' of GaAs doped with a p-type dopant is deposited on a substrate which is not illustrated. An epitaxial layer 6" of p-type $GaAs_{1-x}Sb_x$ is grown by molecular beam epitaxy on the p-type GaAs layer 2'. The p-type $GaAs_{1-x}Sb_x$ layer 6" is graded in composition from the GaAs interface to opposite interface. A layer 4" of GaSb doped with p-type dopant is formed on the p-type $GaAs_{1-x}Sb_x$ graded layer 6". The doping level of the GaSb layer 4" is $1\times10^{19}$ $cm^{-3}$. A metal contact 5 is formed on the n-type GaSb layer 4". From FIG. 5, it is understood that the valence band profile across the interfaces of the above layers has no discontinuity nor potential barrier at each of the interfaces of the above layers. Holes serving as carriers across the interfaces of the layers experience a nearly zero potential barrier. Such desirable conduction band profile being free of any discontinuity or potential barrier at the interfaces between the above layers is due to the existence of the p-type $GaAs_{1-x}Sb_x$ graded layer 6". This results in a 0.1 eV of the Schottky barrier height at the interfaces between the metal contact 5 and the p-type GaSb layer 4". Thus, such non-alloyed low resistance ohmic contact to the p-type GaAs layer is obtained.

Further, another type of low resistance non-alloyed ohmic contacts on a p-type GaAs layer has been known. The structure and property of the non-alloyed ohmic contacts will be described with reference to FIG. 6.

FIG. 6 is a diagram illustrative of energy bands of the low resistance non-alloyed ohmic contacts on p-type GaAs layer. A short-period p-type GaAs/GaSb strained-layer superlattice 7" is grown by molecular beam epitaxy on a p-type GaAs layer 2'. A layer 4" of p-type GaSb is formed on the p-type GaAs/GaSb strained-layer superlattice 7". A metal contact 5 is formed on the p-type GaSb layer 4".

The strained-layer superlattice 7" comprises alternating p-type GaAs and p-type GaSb layers. Each GaSb layer forms a quantum well and each GaAs layer forms potential barrier. Holes serving as carriers are confined in the periodical potential wells in the valence band. In the superlattice structure 7", the thickness of the each GaAs layer and thus the width of the potential barrier is so thin that the resonant tunneling of holes through the potential barrier occurs. Hole currents mainly due to the resonant tunneling flow across the interfaces of the superlattice structure. The hole exhibiting the resonant tunneling across the superlattice structure experience nearly zero potential barrier thereby a low resistance ohmic contact is obtained.

The above ohmic contact using either the InGaAs or GaAsSb graded layer of p-type or n-type are, however, engaged with the following disadvantages which will be investigated.

As described the above, the composition-graded layer providing the low contact resistance and thus a nearly zero Schottky barrier is grown by molecular beam epitaxy. The growing process of the composition-graded layer requires an extremely precise and continuous control of the flux intensity of a molecular beam for growing the composition-graded layer. That is why it is difficult to grow the available composition-graded InGaAs or GaAsSb layer by the molecular beam epitaxy. Particularly, it is extremely difficult to control the flux intensity of a molecular beam of Group-V elements such as As and Sb. The inferiority of the control of the flux intensity of a molecular beam results in an abrupt discontinuity in compositions of the composition-graded layer. Such abrupt discontinuity in the composition causes both high density stacking faults and high density misfit dislocations. This results in an enlargement of the contact resistance. If the over-shoot of the In flux appears in the latter half of the growing process of the composition-graded layer, the flux ratio of Group-V elements to Group-III elements are varied from the design value. This results in a roughness of the surface of the composition-graded layer, in addition the inferiority of the crystal quantity. This causes the enlargement of the contact resistance, for which reason it is no longer possible to obtain any excellent ohmic contact. Although the composition-graded layer is theoretically able to provide an ohmic contact between the metal and compound semiconductor layer, it is actually difficult to provide a desirable low resistive ohmic contact in the high yield and the high reliability due to the difficulty in the control of the flux intensity of composition for the growing of the composition-graded layer by the molecular beam epitaxy.

If the organic metal chemical vapor deposition is used for growing the composition-graded layer in replacement of the molecular beam epitaxy, such problems as the above in the appearances of the staking faults and the misfit dislocations which causes the enlargement in the contact resistance. Therefore, similarly to the molecular beam epitaxy, the organic metal chemical vapor deposition is also not available to grow a high quality composition-graded layer for providing a desirable low resistance ohmic contact.

Consequently, the composition-graded layer has the above mentioned problem in the inferiorities of the low contact resistance, the reliability and the yield of the ohmic contact.

The above ohmic contact using either the InAs/GaAs or GaAs/GaSb strained-layer superlattice of p-type or n-type are also engaged with the following disadvantages which will be investigated with reference to FIG. 7.

As illustrated in FIG. 7, the GaAs/InAs strained-layer superlattice 7 is formed on the GaAs buffer layer 2 overlying a semiconductor substrate 1. The InAs layer 4 overlays the GaAs/InAs strained-layer superlattice 7. The metal contact 5 is formed on the InAs layer 4. As described the above, the GaAs/InAs strained-layer superlattice 7 is grown by the molecular beam epitaxy. In this case, the growing process of the superlattice 7 by the molecular beam epitaxy is free from such difficulty as those in the precise and continuous control of the flux intensity of molecular beams. Namely, the growing process for the superlattice 7 has a facility as compared to the growing process for the composition-graded layer.

According to the Heisenberg's uncertainty principle, it is impossible to specify a precise position of electrons or holes. The electron's position may thus be represented as a wave function of carriers and thus electrons and holes. The superlattice 7 has such a short period of the potential well and the potential barrier as to allow the resonant tunneling between adjacent potential wells. Actually, such short period of the superlattice 7 is generally smaller than a wave length of electrons. Such short period of the superlattice 7 also has respective width constancies of the potential barriers and potential wells. Although the carriers and thus electrons or holes experience a nearly zero potential barrier but only within the superlattice structure, the carriers and thus electrons or holes experience a relatively large potential barrier both at the interface between the superlattice structure 7 and the GaAs buffer layer 2 and at the interface between the superlattice structure and the InAs layer. Physically, the carriers and thus electrons or holes experience such a conduction band profile across the interfaces as that illustrated in FIG. 8 rather than the conduction band profile illustrated in FIG. 2. In this case, the effective energy band profile experienced by electrons is near an energy band profile as illustrated in FIG. 8 across the n-type GaAs layer 2 underlying an n-type $In_{0.5}Ga_{0.5}As$ layer 10 underlying the n-type InAs layer 4 underlying the metal contact 5. The constancy of such short periodical superlattice provides the discontinuity in the conduction band at the superlattice structure. This results in an enlargement of the contact resistance.

Further, the ohmic contact using the superlattice structure has another problems both in the misfit dislocation and in the staking fault due to the lattice mismatch. A lattice constant of InAs is larger by 7% than a lattice constant of GaAs. Such discontinuity of the lattice constants of the InAs/GaAs layers in the superlattice causes the lattice mismatch providing the misfit dislocation and the staking fault in the superlattice structure. The misfit dislocation and the staking fault form space charge regions around thereof. The space charge region due to a high density of the misfit dislocation and the staking fault in the superlattice structure results in a large internal resistance.

Similarly, such misfit dislocation and the staking fault due to the lattice mismatch also appears both at the interface between the GaAs/InAs superlattice structure and the GaAs layer and at the interface between the GaAs/InAs superlattice structure and the InAs layer. Such misfit dislocation and the staking fault form space charge regions around thereof. The space charge region due to a high density of the misfit dislocation and the staking fault in the superlattice structure results in a large internal resistance.

Of course, the p-type GaAs/InAs superlattice also has the above mentioned problems. Further, a difference in the lattice constants between GaAs and GaSb is 8%. Such discontinuity of the lattice constants of the InAs/GaAs layers in the superlattice causes the above problems.

It is therefore required to provide a novel ohmic contact structure on a compound semiconductor layer for a semiconductor device.

SUMMARY OF THE INVENTION

Accordingly, it is a primary object of the present invention to provide a novel ohmic contact structure on a compound semiconductor layer.

It is a further object of the present invention to provide a novel ohmic contact on a compound semiconductor layer, which has an extremely low contact resistance.

It is a still further object of the present invention to provide a novel ohmic contact on a compound semiconductor layer, which is completely free from any potential barrier.

It is a further more object of the present invention to provide a novel ohmic contact on a compound semiconductor layer, which is free from any misfit dislocation and staking fault due to the lattice mismatch.

The above and other objects, features and advantages of the present invention will be apparent from the following descriptions.

The present invention provides a novel ohmic contact device which comprises a first layer made of a first compound semiconductor having a first energy band gap, a superlattice in contact with the first layer, a second layer made of the second compound semiconductor in contact with the superlattice, and a metal contact in contact with the second layer. The superlattice has modulation-periods comprising alternating first very thin layers made of the first compound semiconductor and second very thin layers made of a second compound semiconductor having a second energy band gap which is smaller than the first energy band gap. Thicknesses of the first very thin layers are gradually reduced from an interface of the first layer to an opposite interface. Thicknesses of the second very thin layers are gradually increased from the interface of the first layer to the opposite interface.

The present invention also provides a novel low resistive compound semiconductor multilayer structure which comprises a first layer made of a first compound semiconductor having a first energy band gap, a superlattice in contact with the first layer and a second layer made of the second compound semiconductor in contact with the superlattice. The superlattice has modulation-periods comprising alternating first very thin layers made of the first compound semiconductor and second very thin layers made of a second compound semiconductor having a second energy band gap which is smaller than the first energy band gap. Thicknesses of the first very thin layers are gradually reduced from an interface of the first layer to an opposite interface. Thicknesses of the second very thin layers are gradually increased from the interface of the first layer to the opposite interface.

The present invention also provides a novel ohmic contact device which comprises a superlattice and a metal contact in contact with the superlattice. The superlattice has modulation-periods comprising alternating first very thin layers made of a first compound semiconductor having a first energy band gap and second very thin layers made of a second compound semiconductor having a second energy band gap which is smaller than the first energy band gap. Thicknesses of the first very thin layers are gradually reduced from one surface to an opposite surface of the superlattice. Thicknesses of the second very thin layers are gradually increased from the one surface to the opposite surface of the superlattice. The metal contact is in contact with the most thick one in the second very thin layers at the opposite surface of the superlattice.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
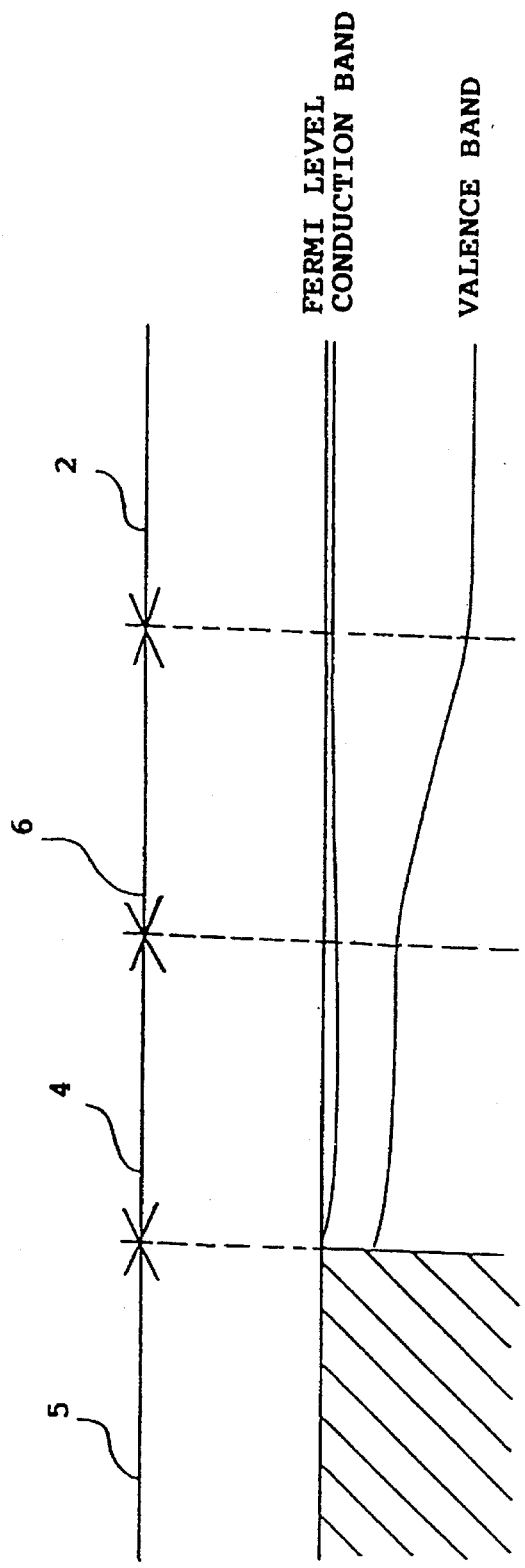
FIG. 1 is a diagram illustrative of energy band profiles of the conventional ohmic contact using the n-type composition-graded layer on the n-type GaAs layer.

The present invention provides a novel non-alloyed ohmic contact on a compound semiconductor layer. The novel non-alloyed ohmic contact includes a modulation-period superlattice structure which provides a nearly zero contact resistance.

The present invention provides a low resistive compound semiconductor multilayer structure which comprises a first layer made of a first compound semiconductor having a first energy band gap, a superlattice in contact with the first layer, and a second layer made of the second compound semiconductor in contact with the superlattice. The superlattice has modulation-periods comprising alternating first very thin layers made of the first compound semiconductor and second very thin layer made of a second compound semiconductor having a second energy band gap being smaller than the first energy band gap. Thicknesses of the first very thin layers are gradually reduced from an interface of the first layer to an opposite interface. Thicknesses of the second very thin layers are gradually increased from the interface of the first layer to the opposite interface.

A first embodiment of the present invention will be described with reference to FIGS. 9 and 10.

A structure of a novel ohmic contact on a compound semiconductor layer of the first embodiment will be described.

A novel ohmic contact is formed on a GaAs compound semiconductor substrate 1. A layer 2 of GaAs doped with an n-type dopant is formed on the GaAs substrate 1. A super-lattice structure 3 which comprises modulation-periods of alternating n-type GaAs/InAs layers is grown on the n-type GaAs layer 3 by molecular beam epitaxy. A layer 4 of InAs doped with an n-type dopant is formed on the n-type GaAs/InAs modulation-period superlattice structure 3. A metal contact 5 is formed on the n-type InAs layer 4.

As described the above, the n-type GaAs/InAs modulation-period superlattice structure 3 comprises the modulation-period of alternating the n-type GaAs layer and the n-type InAs layer. In the modulation-period superlattice 3, widths of the plural GaAs layers are so modulated as to be gradually reduced from 4 nanometers at an interface to the n-type GaAs layer 2 to 0.3 nanometers at an interface to the n-type InAs layer 4. In contrast, widths of the plural InAs layers are so modulated as to be gradually enlarged from 0.3 nanometers at the interface to the n-type GaAs layer 2 to 4 nanometers at the interface to the n-type InAs layer 4. Namely, the average composition of GaAs is gradually reduced from the n-type GaAs layer 2 to the n-type InAs layer 4. The average composition of InAs is gradually enlarged from the n-type GaAs layer 2 to the n-type InAs layer 4. Such modulation-period superlattice 3 has a total thickness of 50 nanometers. The n-type InAs layer 4 has a thickness of 50 nanometers.

With respect to the doping level of the each layers, the n-type GaAs layer 2 has a dopant concentration of $2 \times 10^{18}$ cm$^{-3}$. The n-type InAs layer 4 has a high dopant concentration of $2 \times 10^{19}$ cm$^{-3}$. The n-type GaAs/InAs modulation-period superlattice structure 3 is subjected to such a modulation-doping as to have the dopant concentration exhibit a gradual increase from the dopant concentration of $2 \times 10^{18}$ cm$^{-3}$ at the interface with the n-type GaAs layer 2 to the high dopant concentration of $2 \times 10^{19}$ cm$^{-3}$ at the interface with the n-type InAs layer 4.

The metal contact 5 comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Figure 10:
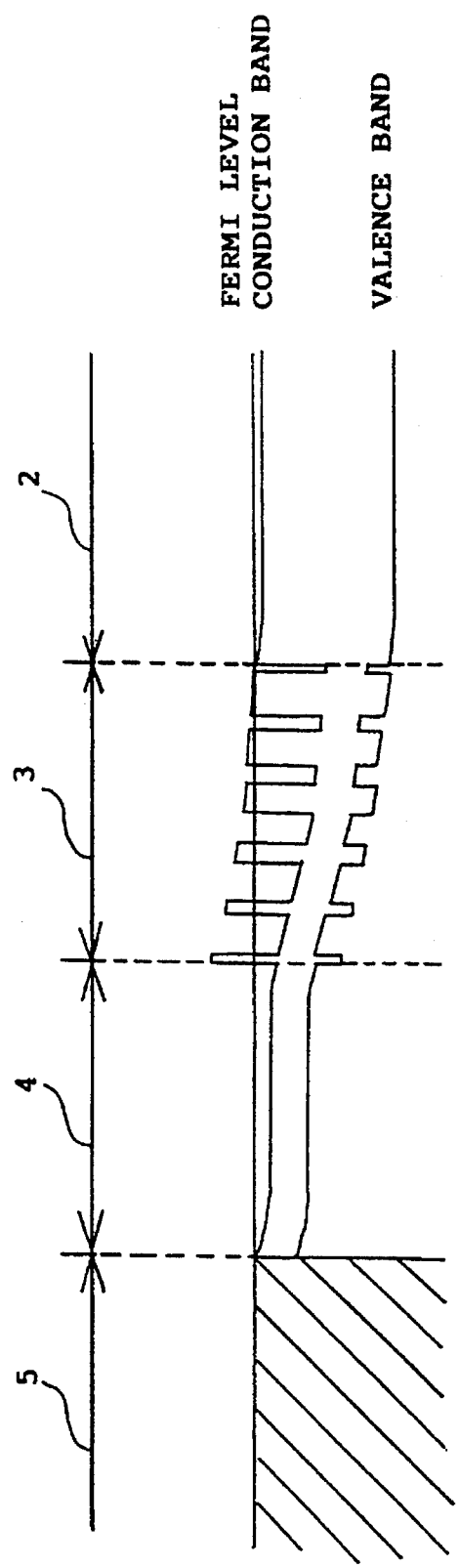
FIG. 10 is a diagram illustrative of energy band profiles of a novel ohmic contact using n-GaAs/n-InAs modulation-period superlattice of a first embodiment according to the present invention.

Properties of the ohmic contact including the n-type modulation-period superlattice to the n-type compound semiconductor layer of the first embodiment according to the present invention will be investigated with reference to FIG. 10 which is illustrative of an energy band profile across the interfaces of the each layer.

With respect to the n-type GaAs layer 2, the conduction band edge exists below the Fermi level. Thus, the energy band gap also exists below the Fermi level.

With respect to the n-type InAs layer 4, the conduction band edge exists below the Fermi level. Thus, the energy band gap also exists below the Fermi level.

With respect to the n-type modulation-period superlattice 3, the n-type GaAs layers provide potential barriers. The n-type InAs layers provide potential wells. Each of the GaAs/InAs layers has such a very thin that electrons serving as carriers are able to exhibit resonant tunneling from a potential well to an adjacent potential well through a potential barrier. The widths of the potential wells are gradually increased from 0.3 nanometers at the interface with the n-type GaAs layer 2 to 4 nanometers at the interface with the n-type InAs layer 4. Contrary to the potential well widths, the widths of the potential barriers are gradually reduced from 4 nanometers at the interface with the n-type GaAs layer 2 to 0.3 nanometers at the interface with the n-type InAs layer 4. In each of the potential wells, a plurality of sub-bands or mini-bands separated by the mini-band gaps exist. Electrons are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the n-type GaAs layer 2, the sub-band energy levels available for electrons are limited. This does not allow many electrons to exist in the potential well, particularly at a deep point in the potential well. In contrast, in the vicinity of the interface to the n-type InAs layer 4, the sub-band energy levels available for electrons are not limited relatively. This allows many electrons to exist in the potential well.

In the vicinity of the interface to the n-type GaAs layer 2, available energy levels for electrons are near to those in the n-type GaAs layer 2. In the vicinity of the interface to the n-type InAs layer 4, available energy levels for electrons are near to those in the n-type InAs layer 4. Electrons effectively experience such a smooth potential profile as that provided by a composition-graded layer. The effective potential profile experienced by electrons is completely free from any barrier due to the conduction band discontinuity. Accordingly, electrons will experience no potential barrier not only in the modulation-period superlattice 3 but also at the interface to either the n-type GaAs layer 2 or the n-type InAs layer 4. Such modulation-period superlattice 3 provides an extremely low resistance ohmic contact to the n-type GaAs compound semiconductor layer 2.

On the other hand, as described above, the modulation-period superlattice 3 is grown by molecular beam epitaxy. The growing process for the modulation-period superlattice 3 is free from the necessity in the continuous and precise control of the flux intensity of molecular beams of In and Ga. This results in a facility in the growing process for the modulation-period superlattice 3. In the modulation-period superlattice 3, as described the above, the widths of the plural GaAs layers are so modulated as to be gradually reduced from the interface with the n-type GaAs layer 2 to the interface with the n-type InAs layer 4. The widths of the plural InAs layers are so modulated as to be gradually enlarged from the interface to the n-type GaAs layer 2 to the interface to the n-type InAs layer 4. Namely, the average composition of GaAs is gradually reduced from the n-type GaAs layer 2 to the n-type InAs layer 4. The average composition of InAs is gradually enlarged from the n-type GaAs layer 2 to the n-type InAs layer 4. The lattice constant is gradually increased from the n-type GaAs layer 2 to the n-type InAs layer 4. There exists no discontinuity in the lattice constant not only in the modulation-period superlattice 3 but also at the interfaces to the n-type GaAs layer 2 and the n-type InAs layer 4. There exists no misfit dislocation nor staking fault in such modulation-period superlattice 3. Accordingly, such ohmic contact including the modulation-period superlattice 3 is free from the rise of the contact resistance due to appearance of the misfit dislocation or staking fault. Such modulation-period superlattice 3 provides an extremely low resistance ohmic contact to the n-type GaAs compound semiconductor layer 2.

The value of the contact resistance of the ohmic contact employing the modulation-period superlattice will be investigated as compared to the contact resistances of the conventional ohmic contact.

In the prior arts, the conventional ohmic contact using the n-type InGaAs composition-graded layer has a contact resistance of $8.6 \times 10^{-8}$ ohms/cm$^3$. Another types of the conventional ohmic contact using the n-type 2 nm/2 nm of GaAs/InAs composition-graded layer has a contact resistance of $1.5 \times 10^{-6}$ ohms/cm$^3$.

In contrast, indeed, the novel ohmic contact employing the p-type GaAs/InAs modulation-period superlattice 3 on the n-type GaAs layer provided by the first embodiment has an extremely low contact resistance of $5.8 \times 10^{-8}$ ohms/cm$^3$.

Alternatively, the n-type InAs layer 4 is replaceable with an n-type InGaAs layer under the condition of a large composition ratio of InAs to Ga.

A second embodiment of the present invention will be described with reference to FIG. 11.

A structure of a novel ohmic contact on a compound semiconductor layer of the second embodiment will be described.

A novel ohmic contact is formed on a GaAs compound semiconductor substrate. A layer 2' of GaAs doped with a p-type dopant is formed on the GaAs substrate. A superlattice structure 3' which comprises modulation-periods of alternating p-type GaAs/InAs layers is grown on the p-type GaAs layer 3' by molecular beam epitaxy. A layer 4' of InAs doped with an p-type dopant is formed on the p-type GaAs/InAs modulation-period superlattice structure 3'. A metal contact 5 is formed on the p-type InAs layer 4'.

As described the above, the p-type GaAs/InAs modulation-period superlattice structure 3' comprises the modulation-periods of alternating the p-type GaAs layer and the p-type InAs layer. In the modulation-period superlattice 3', widths of the plural GaAs layers are so modulated as to be gradually reduced from 4 nanometers at an interface to the p-type GaAs layer 2' to 0.3 nanometers at an interface to the p-type InAs layer 4'. In contrast, widths of the plural InAs layers are so modulated as to be gradually enlarged from 0.3 nanometers at the interface to the p-type GaAs layer 2' to 4 nanometers at the interface to the p-type InAs layer 4'. Namely, the average composition of GaAs is gradually reduced from the p-type GaAs layer 2' to the p-type InAs layer 4'. The average composition of InAs is gradually enlarged from the p-type GaAs layer 2' to the p-type InAs layer 4'. Such modulation-period superlattice 3' has a total thickness of 50 nanometers. The p-type InAs layer 4' has a thickness of 50 nanometers.

With respect to the doping level of the each layers, the p-type GaAs layer 2' has a dopant concentration of $2 \times 10^{18}$ cm$^{-3}$. The p-type InAs layer 4' has a high dopant concentration of $2 \times 10^{19}$ cm$^{-3}$. The p-type GaAs/InAs modulation-period superlattice structure 3' is subjected to such a modulation-doping as to have the dopant concentration exhibit a gradual increase from the dopant concentration of $2 \times 10^{18}$ cm$^{-3}$ at the interface with the p-type GaAs layer 2' to the high dopant concentration of $2 \times 10^{19}$ cm$^{-3}$ at the interface with the p-type InAs layer 4'.

The metal contact 5 comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Figure 11:
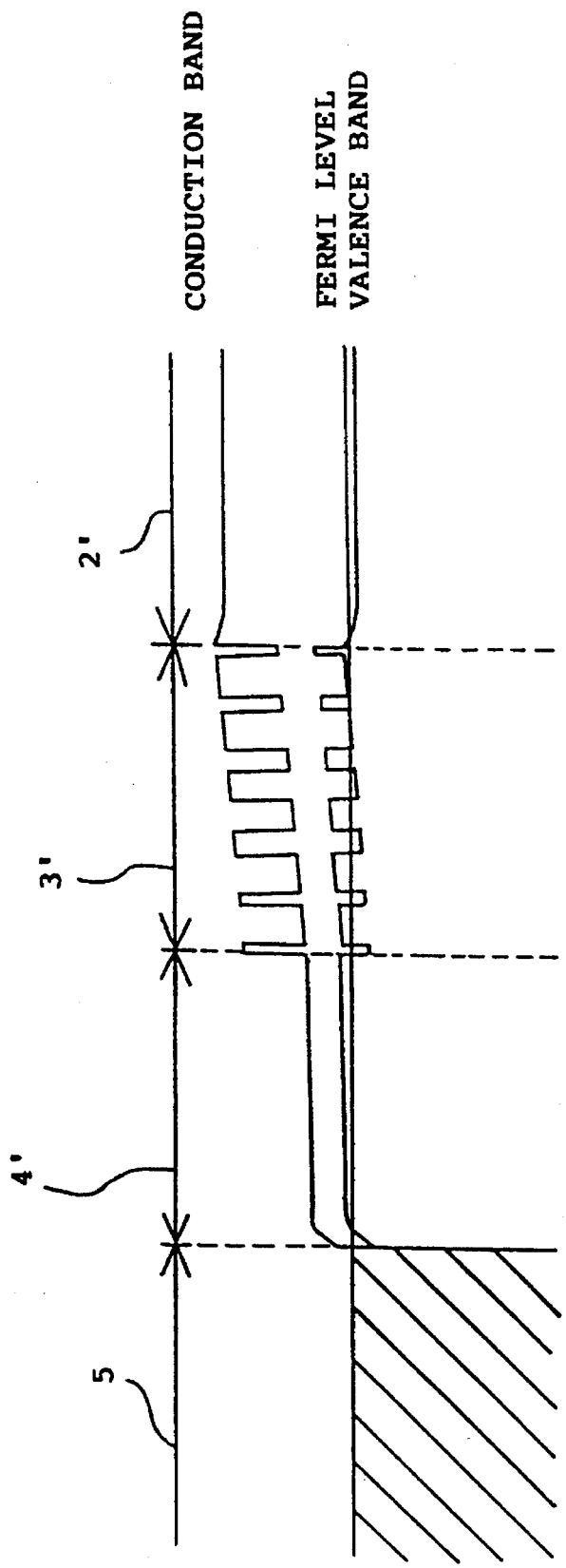
FIG. 11 is a diagram illustrative of energy band profiles of a novel ohmic contact using n-GaAs/n-InAs modulation-period superlattice of a second embodiment according to the present invention.

Properties of the ohmic contact including the p-type modulation-period superlattice to the p-type compound semiconductor layer of the second embodiment according to the present invention will be investigated with reference to FIG. 11 which is illustrative of an energy band profile across the interfaces of the each layer.

With respect to the p-type GaAs layer 2', the conduction band edge exists above the Fermi level. Thus, the valance band edge exists below but in the vicinity of the Fermi level. The Fermi level exists within the energy band gap but near the valence band edge.

With respect to the p-type InAs layer 4', the valance band edge exists above the Fermi level. Thus, the energy band gap also exists above the Fermi level.

With respect to the p-type modulation-period superlattice 3', the p-type GaAs layers provide potential barriers. The p-type InAs layers provide potential wells. Each of the GaAs/InAs layers has such a very thin that holes serving as carriers are able to exhibit resonant tunneling from a potential well to an adjacent potential well through a potential barrier. The widths of the potential wells are gradually increased from 0.3 nanometers at the interface with the p-type GaAs layer 2' to 4 nanometers at the interface with the p-type InAs layer 4'. Contrary to the potential well widths, the widths of the potential barriers are gradually reduced from 4 nanometers at the interface with the p-type GaAs layer 2' to 0.3 nanometers at the interface with the p-type InAs layer 4'. In each of the potential wells, a plurality of sub-bands or mini-bands separated by the miniband gaps exist. Holes are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the p-type GaAs layer 2', the sub-band energy levels available for holes are limited. This does not allow many holes to exist in the potential well, particularly at a deep point in the potential well. In contrast, in the vicinity of the interface to the p-type InAs layer 4', the sub-band energy levels available for holes are not limited relatively. This allows many holes to exist in the potential well.

In the vicinity of the interface to the p-type GaAs layer 2', available energy levels for holes are near to those in the p-type GaAs layer 2'. In the vicinity of the interface to the p-type InAs layer 4', available energy levels for holes are near to those in the p-type InAs layer 4'. Holes effectively experience such a smooth potential profile as that provided by a composition-graded layer. The effective potential profile experienced by holes is completely free from any barrier due to the valence band discontinuity. Accordingly, holes will experience no potential barrier not only in the modulation-period superlattice 3' but also at the interface to either the p-type GaAs layer 2' or the p-type InAs layer 4'. Such modulation-period superlattice 3' provides an extremely low resistance ohmic contact to the p-type GaAs compound semiconductor layer 2'.

On the other hand, as described above, the modulation-period superlattice 3' is grown by molecular beam epitaxy. The growing process for the modulation-period superlattice 3' is free from the necessity in the continuous and precise control of the flux intensity of molecular beams of In and Ga. This results in a facility in the growing process for the modulation-period superlattice 3'. In the modulation-period superlattice 3', as described the above, the widths of the plural GaAs layers are so modulated as to be gradually reduced from the interface with the p-type GaAs layer 2' to the interface with the p-type InAs layer 4'. The widths of the plural InAs layers are so modulated as to be gradually enlarged from the interface to the p-type GaAs layer 2' to the interface to the p-type InAs layer 4'. Namely, the average composition of GaAs is gradually reduced from the p-type GaAs layer 2' to the p-type InAs layer 4'. The average composition of InAs is gradually enlarged from the p-type GaAs layer 2' to the p-type InAs layer 4'. The lattice constant is gradually increased from the p-type GaAs layer 2' to the p-type InAs layer 4'. There exists no discontinuity in the lattice constant not only in the modulation-period superlattice 3' but also at the interfaces to the p-type GaAs layer 2' and the p-type InAs layer 4'. There exists no misfit dislocation nor staking fault in such modulation-period superlattice 3'. Accordingly, such ohmic contact including the modulation-period superlattice 3' is free from the rise of the contact resistance due to appearance of the misfit dislocation or staking fault. Such modulation-period superlattice 3' provides an extremely low resistance ohmic contact to the p-type GaAs compound semiconductor layer 2'.

The value of the contact resistance of the ohmic contact employing the modulation-period superlattice will be investigated.

Indeed, the novel ohmic contact employing the p-type GaAs/InAs modulation-period superlattice 3' on the p-type GaAs layer provided by the second embodiment has an extremely low contact resistance of $1 \times 10^{-6}$ ohms/cm$^3$.

A third embodiment of the present invention will be described with reference to FIG. 12.

A structure of a novel ohmic contact on a compound semiconductor layer of the third embodiment will be described.

A novel ohmic contact is formed on a GaAs compound semiconductor substrate. A layer 2' of GaAs doped with a p-type dopant is formed on the GaAs substrate. A superlattice structure 3" which comprises modulation-periods of alternating p-type GaAs/GaSb layers is grown on the p-type GaAs layer 3" by molecular beam epitaxy. A layer 4" of GaSb doped with an p-type dopant is formed on the p-type GaAs/GaSb modulation-period superlattice structure 3". A metal contact 5 is formed on the p-type GaSb layer 4".

As described the above, the p-type GaAs/GaSb modulation-period superlattice structure 3" comprises the modulation-periods of alternating the p-type GaAs layer and the p-type GaSb layer. In the modulation-period superlattice 3", widths of the plural GaAs layers are so modulated as to be gradually reduced from 4 nanometers at an interface to the p-type GaAs layer 2' to 0.3 nanometers at an interface to the p-type GaSb layer 4". In contrast, widths of the plural GaSb layers are so modulated as to be gradually enlarged from 0.3 nanometers at the interface to the p-type GaAs layer 2' to 4 nanometers at the interface to the p-type GaSb layer 4". Namely, the average composition of GaAs is gradually reduced from the p-type GaAs layer 2' to the p-type GaSb layer 4". The average composition of GaSb is gradually enlarged from the p-type GaAs layer 2' to the p-type GaSb layer 4". Such modulation-period superlattice 3" has a total thickness of 50 nanometers. The p-type GaSb layer 4" has a thickness of 50 nanometers.

With respect to the doping level of the each layers, the p-type GaAs layer 2' has a dopant concentration of $2\times10^{18}$ cm$^{-3}$. The p-type GaSb layer 4" has a high dopant concentration of $2\times10^{19}$ cm$^{-3}$. The p-type GaAs/GaSb modulation-period superlattice structure 3" is subjected to such a modulation-doping as to have the dopant concentration exhibit a gradual increase from the dopant concentration of $2\times10^{18}$ cm$^{-3}$ at the interface with the p-type GaAs layer 2' to the high dopant concentration of $2\times10^{19}$ cm$^{-3}$ at the interface with the p-type GaSb layer 4".

The metal contact 5 comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Figure 12:
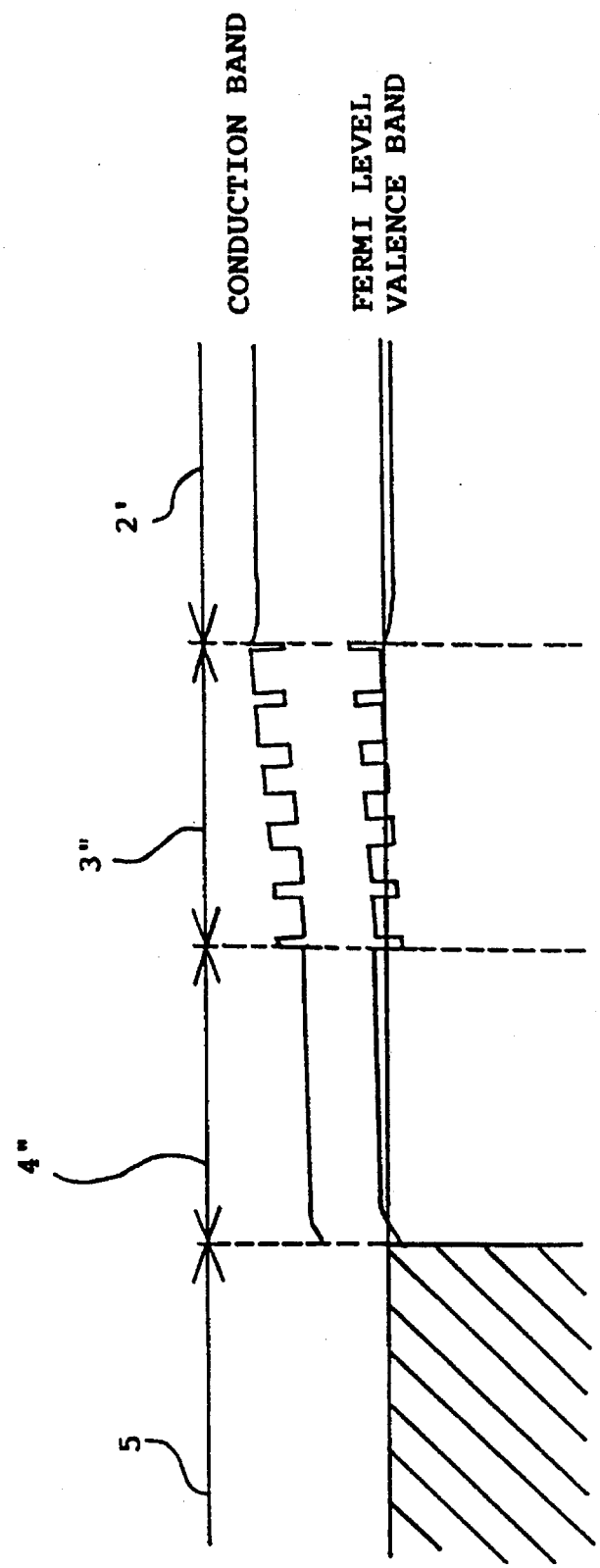
FIG. 12 is a diagram illustrative of energy band profiles of a novel ohmic contact using n-GaAs/n-InAs modulation-period superlattice of a third embodiment according to the present invention.

Properties of the ohmic contact including the p-type modulation-period superlattice to the p-type compound semiconductor layer of the third embodiment according to the present invention will be investigated with reference to FIG. 12 which is illustrative of an energy band profile across the interfaces of the each layer.

With respect to the p-type GaAs layer 2', the conduction band edge exists above the Fermi level. Thus, the valance band edge exists below but in the vicinity of the Fermi level. The Fermi level exists within the energy band gap but near the valence band edge.

With respect to the p-type GaSb layer 4", the valance band edge exists above the Fermi level. Thus, the energy band gap also exists above the Fermi level.

With respect to the p-type modulation-period superlattice 3", the p-type GaAs layers provide potential barriers. The p-type GaSb layers provide potential wells. Each of the GaAs/GaSb layers has such a very thin that holes serving as carriers are able to exhibit resonant tunneling from a potential well to an adjacent potential well through a potential barrier. The widths of the potential wells are gradually increased from 0.3 nanometers at the interface with the p-type GaAs layer 2' to 4 nanometers at the interface with the p-type GaSb layer 4". Contrary to the potential well widths, the widths of the potential barriers are gradually reduced from 4 nanometers at the interface with the p-type GaAs layer 2' to 0.3 nanometers at the interface with the p-type GaSb layer 4". In each of the potential wells, a plurality of sub-bands or mini-bands separated by the mini-band gaps exist. Holes are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the p-type GaAs layer 2', the sub-band energy levels available for holes are limited. This does not allow many holes to exist in the potential well, particularly at a deep point in the potential well. In contrast, in the vicinity of the interface to the p-type GaSb layer 4", the sub-band energy levels available for holes are not limited relatively. This allows many holes to exist in the potential well.

In the vicinity of the interface to the p-type GaAs layer 2', available energy levels for holes are near to those in the p-type GaAs layer 2'. In the vicinity of the interface to the p-type GaSb layer 4", available energy levels for holes are near to those in the p-type GaSb layer 4". Holes effectively experience such a smooth potential profile as that provided by a composition-graded layer. The effective potential profile experienced by holes is completely free from any barrier due to the valence band discontinuity. Accordingly, holes will experience no potential barrier not only in the modulation-period superlattice 3" but also at the interface to either the p-type GaAs layer 2' or the p-type GaSb layer 4". Such modulation-period superlattice 3" provides an extremely low resistance ohmic contact to the p-type GaAs compound semiconductor layer 2'.

On the other hand, as described above, the modulation-period superlattice 3" is grown by molecular beam epitaxy. The growing process for the modulation-period superlattice 3" is free from the necessity in the continuous and precise control of the flux intensity of molecular beams of As and Sb. This results in a facility in the growing process for the modulation-period superlattice 3". In the modulation-period superlattice 3", as described the above, the widths of the plural GaAs layers are so modulated as to be gradually reduced from the interface with the p-type GaAs layer 2' to the interface with the p-type GaSb layer 4". The widths of the plural GaSb layers are so modulated as to be gradually enlarged from the interface to the p-type GaAs layer 2' to the interface to the p-type GaSb layer 4". Namely, the average composition of GaAs is gradually reduced from the p-type GaAs layer 2' to the p-type GaSb layer 4". The average composition of GaSb is gradually enlarged from the p-type GaAs layer 2' to the p-type GaSb layer 4". The lattice constant is gradually increased from the p-type GaAs layer 2' to the p-type GaSb layer 4". There exists no discontinuity in the lattice constant not only in the modulation-period superlattice 3" but also at the interfaces to the p-type GaAs layer 2' and the p-type GaSb layer 4". There exists no misfit dislocation nor staking fault in such modulation-period superlattice 3". Accordingly, such ohmic contact including the modulation-period superlattice 3" is free from the rise of the contact resistance due to appearance of the misfit dislocation or staking fault. Such modulation-period superlattice 3" provides an extremely low resistance ohmic contact to the p-type GaAs compound semiconductor layer 2'. The value of the contact resistance of the ohmic contact employing the modulation-period superlattice will be investigated.

Indeed, the novel ohmic contact employing the p-type GaAs/GaSb modulation-period superlattice 3" on the p-type GaAs layer provided by the second embodiment has an extremely low contact resistance of $1\times10^{-7}$ ohms/cm$^3$.

As a modification of the metal contact, although in the above embodiments, the metal contact 5 comprises the Ti/Pt/Au layers, other metals such as tungsten silicide are also available as a material for the metal contact.

The thickness and doping level of each of the layers may be so modified as to match variable conditions.

Such desirable ohmic contacts provided by the above embodiments are of course applicable to contacts of electrical and optical devices, particularly high speed and high frequency heterostructure transistors such as the high electron mobility transistor (HEMT) and the heterojunction bipolar transistor (HBT). Such extremely low resistance ohmic contact provided by the embodiments allows the electrical and optical devices to exhibit excellent performances such as high speed and high frequency performances.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope of the invention.

What is claimed is:

1. A low resistance metal-semiconductor ohmic contact multi-layer structure comprising:

an n-GaAs layer;

a modulated-period, strain-layered superlattice structure disclosed on said n-GaAs layer;

an n-InGaAs layer having a large ratio of InAs to Ga and disposed on said modulated-period, strain-layered superlattice structure; and a metal layer disposed on said n-InGaAs layer;

wherein said modulated-period, strain-layered superlattice structure comprises:

a plurality of alternating lamination of n-GaAs strained layers having a first energy band gap and n-InAs strained layers having a second energy band gap smaller than first energy band gap, said n-GaAs strained layers having various thicknesses decreasing in a direction toward said metal layer, said n-InAs strained layers having various thicknesses increasing in said direction;

wherein a ratio of said thicknesses of said n-GaAs and n-InAs strained layers is varied to substantially eliminate discontinuities in the lattice constant at the interfaces between said n-GaAs and n-InAs strained-layers, and at the interfaces between said superlattice structure and said n-InGaAs and between said superlattice structure and said n-GaAs layer;

wherein said strained-layer superlattice structure has a modulated period of a short duration so as to exhibit a substantially smooth and continuous potential profile and substantially no potential barriers nor potential wells, to thereby permit said strained-layer superlattice structure to perform as a superlattice alloy-like material; and wherein said n-GaAs and n-InAs strained layers are so doped that said strained-layer superlattice structure has an impurity concentration profile in which said impurity concentration is graded from $2\times10^{18}$ cm$^{-3}$ to $2\times10^{19}$ cm$^{-3}$ in said direction toward said metal layer so that said metal-semiconductor ohmic contact has a resistance of less than $5.8\times10^{-8}$ ohms/cm$^2$.

2. An ohmic electrode comprising:

a metal contact;

a p-InGaAs layer having a large ratio of InAs to Ga and being in contact with said metal contact;

a strained-layer superlattice layer being in contact with said p-InGaAs layer; and a p-InAs layer being in contact with said strained-layer superlattice layer;

wherein said strained-layer superlattice layer comprises:

a plurality of alternating lamination of p-GaAs strained layers having a first energy band gap and p-InAs strained layers having a second energy band gap, said p-GaAs strained layers having various thicknesses decreasing from approximately 4 nanometers to approximately 0.3 nanometers in a direction toward said metal contact, said p-InAs strained layers having various thicknesses increasing from approximately 0.3 nanometers to approximately 4 nanometers in said direction;

wherein a ratio of said thicknesses of said p-GaAs and p-InAs strained layers is varied to substantially eliminate discontinuities in the lattice constant at the interfaces between the p-GaAs and p-InAs strained layers and at the interfaces between said superlattice structure and said p-InGaAs layer and between said superlattice structure and said p-InAs layer;

wherein said strained-layer superlattice structure has a modulated period of a short duration sufficiently smaller than the wavelengths of the carriers so as to exhibit a substantially smooth and continuous potential profile and substantially no potential barriers nor potential wells, to thereby permit said strained layer superlattice structure to perform as a superlattice alloy-like material; and wherein said p-GaAs and p-InAs strained layers are so doped that said strained-layer superlattice structure has an impurity concentration profile in which said impurity concentration is graded from $2\times10^{18}$ cm$^{-3}$ to $2\times10^{19}$ cm$^{-3}$ in said direction toward said metal layer so that said metal-semiconductor ohmic contact has a resistance of less than $1\times10^{-6}$ ohms/cm$^2$.

3. An ohmic electrode comprising:

a metal contact;

a p-GaAsSb layer having a large ratio of GaSb to As and being in contact with said metal contact;

a strained-layer superlattice layer having a thickness of approximately 50 nanometers and being in contact with said p-GaAsSb layer; and a p-GaAs layer being in contact with said strained-layer superlattice layer;

wherein said strained-layer superlattice layer comprises:

a plurality of alternating lamination of p-GaAs strained layers having a first energy band gap and p-GaSb strained layers having a second energy band gap, said p-GaAs strained layers having various thicknesses decreasing from approximately 4 nanometers to approximately 0.3 nanometers in a direction toward said metal contact, said p-GaSb strained layers having various thicknesses increasing from approximately 0.3 nanometers to approximately 4 nanometers in said direction;

wherein a ratio of said thicknesses of said p-GaAs and p-GaSb strained layers is varied to substantially eliminate discontinuities in the lattice constant at the interfaces between said p-GaAs and p-GaSb strained layers and at the interfaces between said superlattice structure and said p-GaAsSb layer and between said superlattice structure and said p-GaAs layer;

wherein said strained-layer superlattice structure has a modulated period of a short duration so as to exhibit a substantially smooth and continuous potential profile and substantially no potential barriers nor potential wells, to thereby permit said strained layer superlattice structure to perform as a superlattice alloy-like material; and wherein said p-GaAs and p-GaSb strained layers are so doped that said strained-layer superlattice structure has an impurity concentration profile in which said impurity concentration is graded from $2\times10^{18}$ cm$^{-3}$ to $2\times10\,10^{19}$ cm$^{-3}$ in said direction toward said metal layer so that said metal-semiconductor ohmic contact has a resistance of less than $1\times10^{-7}$ ohms/cm$^2$.

* * * * *

UNITED STATES PATENT AND TRADEMARK OFFICE
CERTIFICATE OF CORRECTION

PATENT NO. : 5,604,356
DATED : February 18, 1997
INVENTOR(S) : Yasushi Shiraishi It is certified that error appears in the above-identified patent and that said Letters Patent is hereby corrected as shown below:

Columns 1-16 should be deleted to appear as per attached columns 1-16

Signed and Sealed this

Twenty-first Day of April, 1998

Attest:

BRUCE LEHMAN

Attesting Officer     Commissioner of Patents and Trademarks

SUPERLATTICE OHMIC CONTACT ON A COMPOUND SEMICONDUCTOR LAYER

BACKGROUND OF THE INVENTION

The invention relates to an ohmic contact on a compound semiconductor layer, and more particularly to a non-alloyed ohmic contact having a super-lattice structure for a compound semiconductor device.

It is well known that parasitic resistances deteriorate the overall performances of semiconductor devices. One of the principal causes of the parasitic resistances is the contact resistance such as a Schottky barrier which appears at the metal-semiconductor interface. The reduction of the potential barrier height is important to allow semiconductor devices exhibit such excellent performances as high speed and high frequency performances, particularly for submicron devices which utilize excellent properties of heterostructures such as HEMT (high electron mobility transistor) and HBT (heterojunction bipolar transistor). The scaling down of the device is being done to improve the performance and allow for a high density of the integrated circuits. The importance and necessity of the reduction of the potential barrier or the contact resistance at the metal-semiconductor interface are on the increase, as both the scaling down of the device and thus the reduction of the device dimension and the improvements in the high speed and high frequency performances are increasingly required. Ohmic contacts are well known as an ideal contact free of the potential barrier and thus the metal-semiconductor contact resistance. Alloyed ohmic contacts have problems in the vertical and lateral diffusion of contact metal due to a high temperature processing. As the scaling down of the device is improved, such problems with the alloyed ohmic contacts are more considerable. That is why non-alloyed ohmic contacts tend to take an extremely important role. Some types of non-alloyed ohmic contacts on the compound semiconductor layer have been proposed. Typical non-alloyed ohmic contacts on the compound semiconductor layer such as GaAs layer will be described as the prior art.

Low resistance non-alloyed ohmic contacts on an n-type GaAs layer are disclosed in Journal of Vacuum Science and Technology, 1981, Vol. 19. pp. 626–627, "Ohmic contacts to n-GaAs using graded band gap layers of $Ga_{1-x}In_xAs$ grown by molecular beam epitaxy" J. M. Woodall et. al. The structure and property of the non-alloyed ohmic contacts will be described with reference to FIG. 1.

FIG. 1 is a diagram illustrative of energy bands of the low resistance non-alloyed ohmic contacts on n-type GaAs layer. A layer 2 of GaAs doped with an n-type dopant is deposited on a substrate which is not illustrated. An epitaxial layer 6 of n-type $Ga_{1-x}In_xAs$ is grown by molecular beam epitaxy on the n-type GaAs layer 2. The n-type $Ga_{1-x}In_xAs$ layer 6 is graded in composition from x=0 at the GaAs interface to x=1 at opposite interface. A layer 4 of InAs doped with n-type dopant is formed on the n-type $Ga_{1-x}In_xAs$ graded layer 6. A metal contact 5 is formed on the n-type InAs layer 4. From FIG. 1, it is understood that the conduction band profile of the contact across the interfaces of the above layers has no discontinuity nor potential barrier at each of the interfaces of the above layers. Such desirable conduction band profile being free of any discontinuity or potential barrier at the interfaces between the above layers is due to the existence of the n-type $Ga_{1-x}In_xAs$ graded layer 6. This results in a nearly zero Schottky barrier height at the interfaces between the metal contact 5 and the n-type InAs layer 4. Thus, such non-alloyed low resistance ohmic contact to the n-type GaAs layer is obtained.

Further, another type of low resistance non-alloyed ohmic contacts on an n-type GaAs layer is disclosed in Applied Physics Letters, Vol. 53, pp-900, 1988, "Extremely low resistance non-allowed ohmic contacts on n-type GaAs using InAs/InGaAs and InAs/GaAs strained-layer superlattices", C. K. Peng, at. al. The structure and property of the non-alloyed ohmic contacts will be described with reference to FIG. 2.

Figure 2:
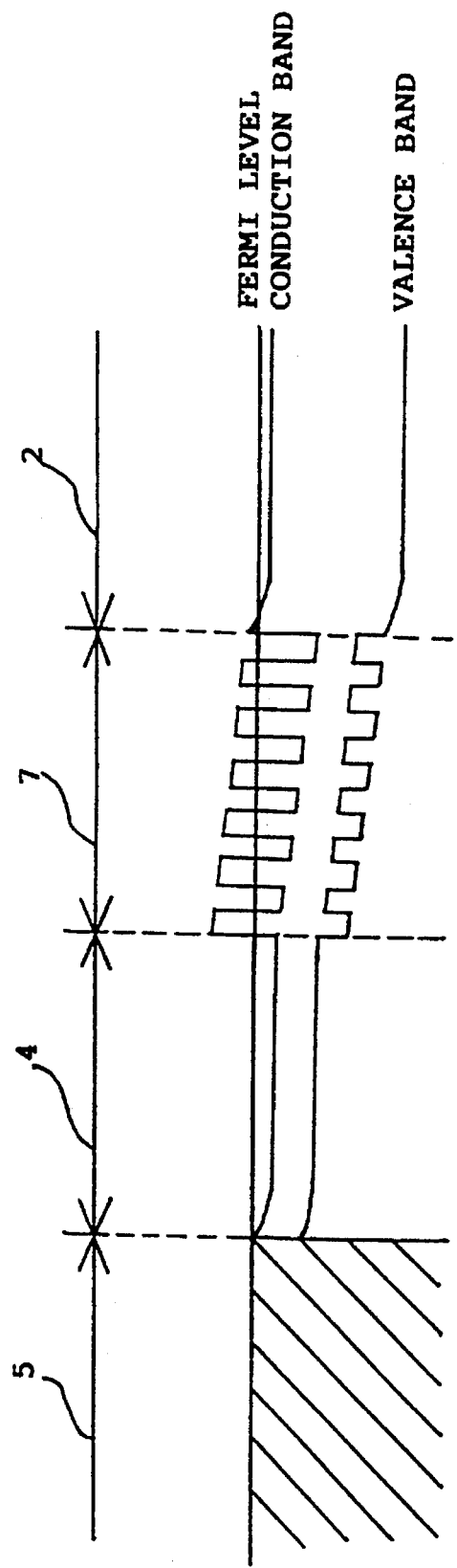
FIG. 2 is a diagram illustrative of energy band profiles of the conventional ohmic contact using the n-type strained-layer superlattice on the n-type GaAs layer.

FIG. 2 is a diagram illustrative of energy bands of the low resistance non-alloyed ohmic contacts on n-type GaAs layer. A short-period n-type GaAs/InAs strained-layer superlattice 7 is grown by molecular beam epitaxy on a n-type GaAs layer 2. A layer 4 of n-type InAs is formed on the n-type GaAs/InAs strained-layer superlattice 7. A metal contact 5 is formed on the n-type InAs layer 4.

The strained-layer superlattice 7 comprises alternating n-type GaAs and n-type InAs layers. Each InAs layer forms a quantum well and each GaAs layer forms potential barrier. Electrons serving as carriers may transfer from each potential barrier to the periodical potential wells in the conduction band leading to the lowering of the effective potential barrier. In the superlattice, the period is so short that tunneling of electrons through the potential barrier occurs. Electron currents are generated mainly due to the tunneling through the interfaces of the superlattice structure. The electrons exhibiting the resonant tunneling across the super-lattice structure experience nearly zero potential barrier, thereby a low resistance ohmic contact is obtained.

Another type of low resistance non-alloyed ohmic contacts on a p-type GaAs layer is disclosed in Electronics Letters 16th August 1990 Vol. 26, No. 17, "Very low resistivity ohmic contact to p-type GaAs using $In_xGa_{1-x}As$ interlayer", P. L. Janega at al. The structure and property of the non-alloyed ohmic contacts will be described with reference to FIG. 3.

Figure 3:
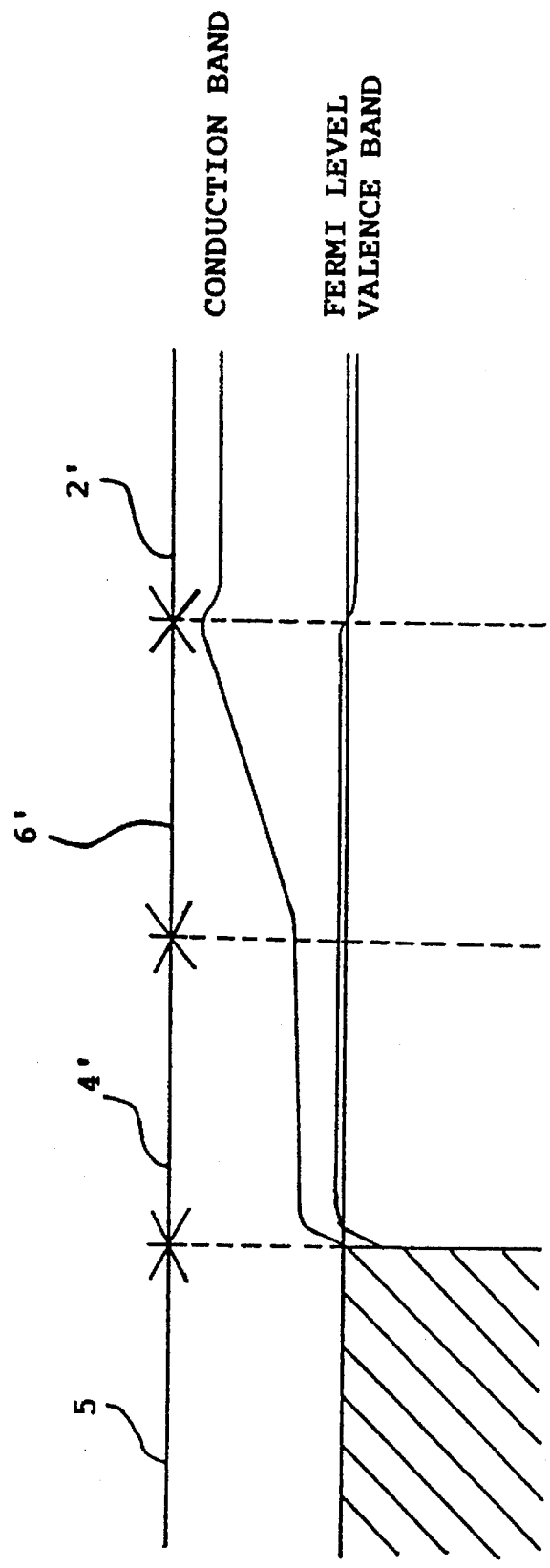
FIG. 3 is a diagram illustrative of energy band profiles of the conventional ohmic contact using the p-type composition-graded layer on the p-type GaAs layer.

FIG. 3 is a diagram illustrative of energy bands of the low resistance non-alloyed ohmic contacts on p-type GaAs layer. A layer 2' of GaAs doped with a p-type dopant is deposited on a substrate which is not illustrated. An epitaxial layer 6' of p-type $Ga_{1-x}In_xAs$ is grown by molecular beam epitaxy on the p-type GaAs layer 2'. The p-type $Ga_{1-x}In_xAs$ layer 6' is graded in composition from x=0.07 at the GaAs interface to 0.5 at opposite interface. A layer 4' of $In_{0.5}Ga_{0.5}As$ doped with a p-type dopant is formed on the p-type $Ga_{1-x}In_xAs$ graded layer 6'. The doping level of the p-type $In_{0.5}Ga_{0.5}As$ layer is $1\times10^{19}$ atom/cm$^3$. A metal contact 5 is formed on the n-type $In_{0.5}Ga_{0.5}As$ layer 4'. From FIG. 3, it is understood that the valence band profile across the interfaces of the above layers has no discontinuity nor potential barrier at each of the interfaces of the above layers. Holes serving as carriers across the interfaces of the layers experience a nearly zero potential barrier. Such desirable conduction band profile being free of any discontinuity or potential barrier at the interfaces between the above layers is due to the existence of the p-type $Ga_{1-x}In_xAs$ graded layer 6'. This results in a 0.4 eV to 0.5 eV of the Schottky barrier height at the interfaces between the metal contact 5 and the p-type $In_{0.5}Ga_{0.5}As$ layer 4'. Thus, such low resistance non-alloyed ohmic contact to the p-type GaAs layer is obtained.

Further, another type of low resistance non-alloyed ohmic contacts on a p-type GaAs layer has been known. The structure and property of the non-alloyed ohmic contacts will be described with reference to FIG. 4.

Figure 4:
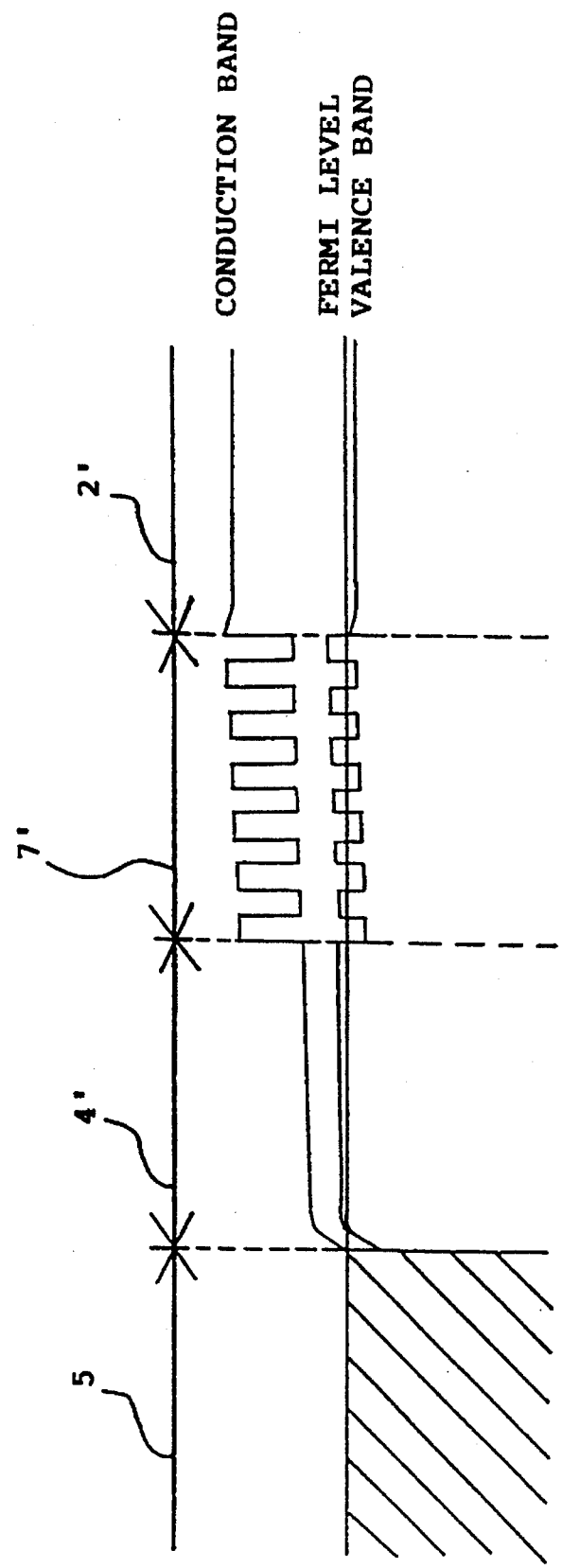
FIG. 4 is a diagram illustrative of energy band profiles of the conventional ohmic contact using the p-type strained-layer superlattice on the p-type GaAs layer.

FIG. 4 is a diagram illustrative of energy bands of the low resistance non-alloyed ohmic contacts on p-type GaAs layer. A short-period p-type GaAs/InAs strained-layer superlattice 7' is grown by molecular beam epitaxy on a p-type GaAs layer 2'. A layer 4' of p-type InAs is formed on the p-type GaAs/InAs strained-layer superlattice 7'. A metal contact 5 is formed on the p-type InAs layer 4'.

The strained-layer superlattice 7' comprises alternating p-type GaAs and p-type InAs layers. Each InAs layer forms a quantum well and each GaAs layer forms potential barrier. Holes serving as carriers may transfer from each potential barrier to the periodical potential wells in the valence band leading to the lowering of the effective potential barrier. In the superlattice structure 7', the period is so short that the tunneling of holes through the potential barrier occurs. Hole currents occur mainly due to the tunneling through the superlattice structure. The holes exhibiting the tunneling through the superlattice structure experience nearly zero potential barrier thereby a low resistance ohmic contact is obtained.

Another type of low resistance non-alloyed ohmic contacts on a p-type GaAs layer is disclosed in IEEE Electron Devices Letters 1987 Vol. 8, No. 30, "An(Al,Ga)As/GaAs Heterostructure Bipolar Transistor with Nonalloyed Graded-Gap Ohmic Contacts to the Base and Emitter", M. A. Rao et al. The structure and property of the non-alloyed ohmic contacts will be described with reference to FIG. 5.

Figure 5:
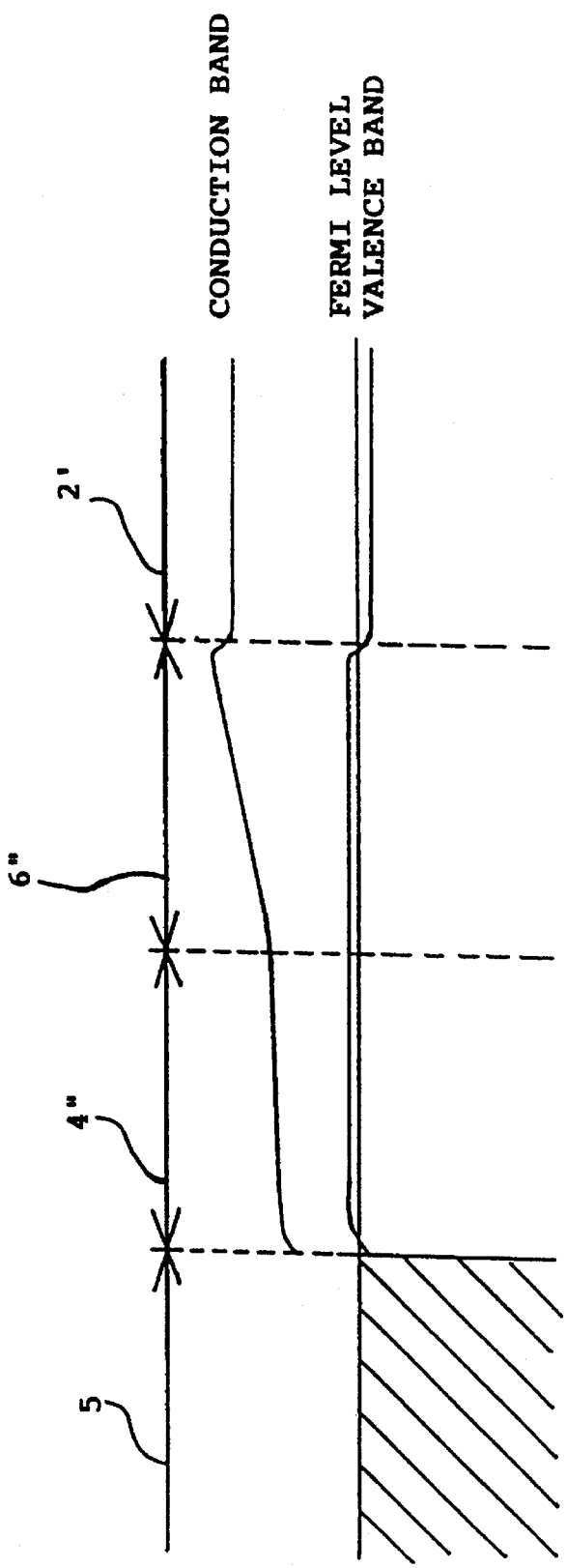
FIG. 5 is a diagram illustrative of energy band profiles of the conventional ohmic contact using the p-type composition-graded layer on the p-type GaAs layer.

FIG. 5 is a diagram illustrative of energy bands of the low resistance non-alloyed ohmic contacts on p-type GaAs layer. A layer 2' of GaAs doped with a p-type dopant is deposited on a substrate which is not illustrated. An epitaxial layer 6' of p-type $GaAs_{1-x}Sb_x$ is grown by molecular beam epitaxy on the p-type GaAs layer 2'. The p-type $GaAs_{1-x}Sb_x$ layer 6'' is graded in composition from the GaAs interface to opposite interface. A layer 4'' of GaSb doped with p-type dopant is formed on the p-type $GaAs_{1-x}Sb_x$ graded layer 6''. The doping level of the GaSb layer 4'' is $1\times10^{19}$ $cm^{-3}$. A metal contact 5 is formed on the p-type GaSb layer 4''. From FIG. 5, it is understood that the valence band profile across the interfaces of the above layers has no discontinuity nor potential barrier at each of the interfaces of the above layers. Holes serving as carriers across the interfaces of the layers experience a nearly zero potential barrier. Such desirable conduction band profile being free of any discontinuity or potential barrier at the interfaces between the above layers is due to the existence of the p-type $GaAs_{1-x}Sb_x$ graded layer 6''. This results in a 0.1 eV of the Schottky barrier height at the interfaces between the metal contact 5 and the p-type GaSb layer 4''. Thus, such non-alloyed low resistance ohmic contact to the p-type GaAs layer is obtained.

Further, another type of low resistance non-alloyed ohmic contacts on a p-type GaAs layer has been known. The structure and property of the non-alloyed ohmic contacts will be described with reference to FIG. 6.

Figure 6:
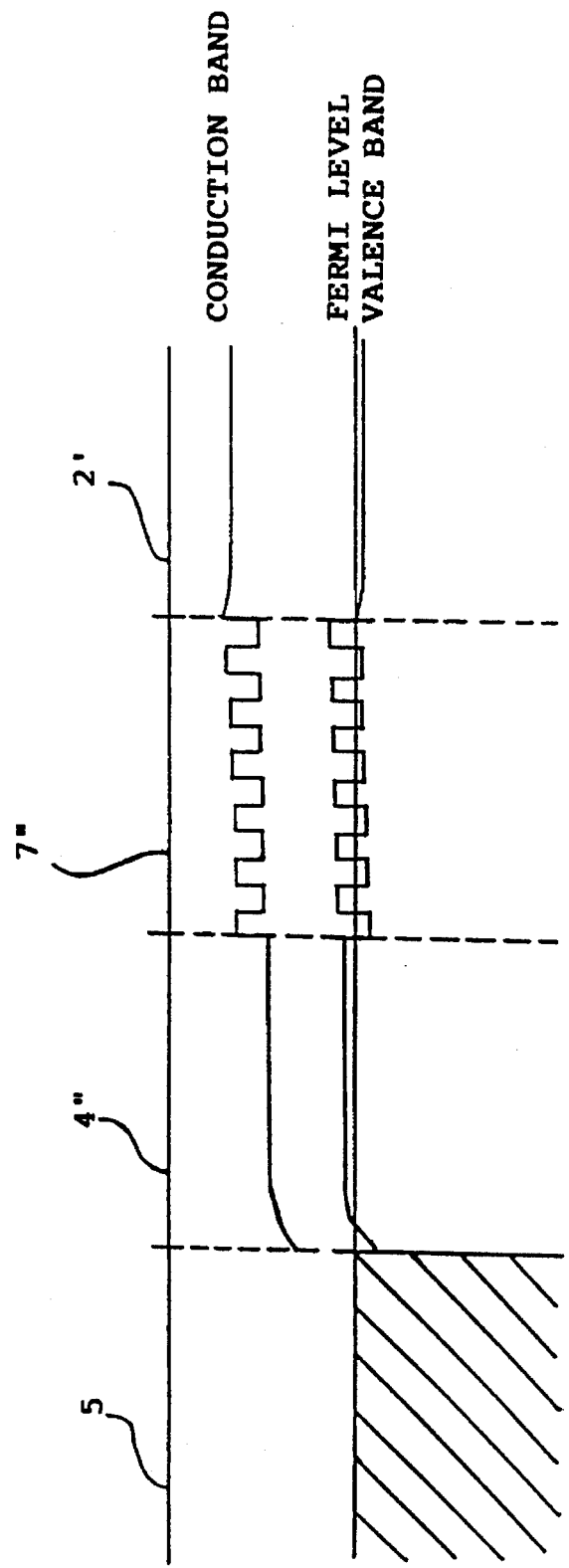
FIG. 6 is a diagram illustrative of energy band profiles of the conventional ohmic contact using the p-type strained-layer superlattice on the p-type GaAs layer.

FIG. 6 is a diagram illustrative of energy bands of the low resistance non-alloyed ohmic contacts on p-type GaAs layer. A short-period p-type GaAs/GaSb strained-layer superlattice 7'' is grown by molecular beam epitaxy on a p-type GaAs layer 2'. A layer 4'' of p-type GaSb is formed on the p-type GaAs/GaSb strained-layer superlattice 7''. A metal contact 5 is formed on the p-type GaSb layer 4''.

The strained-layer superlattice 7' comprises alternating p-type GaAs and p-type GaSb layers. Each GaSb layer forms a quantum well and each GaAs layer forms potential barrier. Holes serving as carriers may transfer from each potential barrier to the periodical potential wells in the valence band leading to the lowering of the effective potential barrier. In the superlattice structure 7'', the period is so short that the tunneling of holes through the potential barrier occurs. Hole currents occur mainly due to the tunneling through the superlattice structure. The hole exhibiting the tunneling through the superlattice structure experience nearly zero potential barrier thereby a low resistance ohmic contact is obtained.

The above ohmic contact using either the InGaAs or GaAsSb graded layer of p-type or n-type are, however, engaged with the following disadvantages which will be investigated.

As described the above, the compositionally graded layers provide the low contact resistances and thus potential barriers are grown by molecular beam epitaxy. The growth of the compositionally graded layer requires an extremely precise and continuous control of the flux intensity of a molecular beam for growing the compositionally graded layer. That is why it is difficult to grow the available compositionally graded InGaAs or GaAsSb layer by the molecular beam epitaxy. Particularly, it is extremely difficult to control the flux intensity of a molecular beam of Group-V elements such as As and Sb. The inferiority of the control of the flux intensity of a molecular beam results in an abrupt discontinuity in compositions of the compositionally graded layer. Such abrupt discontinuity in the composition causes both high density of stacking faults and high density of misfit dislocations. This results in an enlargement of the contact resistance. If the over-shoot of the In flux appears in the latter half of the growth of the compositionally graded layer, the flux ratio of Group-V elements to Group-III elements are varied from the design value. This results in a roughness of the surface of the compositionally graded layer, in addition to the inferiority of the crystal quantity. This causes the enlargement of the contact resistance, for which reason it is no longer possible to obtain any excellent ohmic contact. Although the compositionally graded layer is theoretically able to provide an ohmic contact between the metal and compound semiconductor layer, it is actually difficult to provide a desirable low resistive ohmic contact in the high yield and the high reliability due to the difficulty in the control of the flux intensity for the growth of the compositionally graded layer by the molecular beam epitaxy.

If the organic metal chemical vapor deposition is used for growing the compositionally graded layer in replacement of the molecular beam epitaxy, such problems as the above in the appearances of the stacking faults and the misfit dislocations and in the roughness of the epitaxial layer surface and the degradation of the crystal quality, cause the enlargement in the contact resistance. Therefore, similarly to the molecular beam epitaxy, the organic metal chemical vapor deposition is also not available to grow a high quality compositionally graded layer for providing a desirable low resistance ohmic contact.

Consequently, the compositionally graded layer has the above mentioned problem in the inferiorities of the low contact resistance, the reliability and the yield of the ohmic contact.

Figure 7:
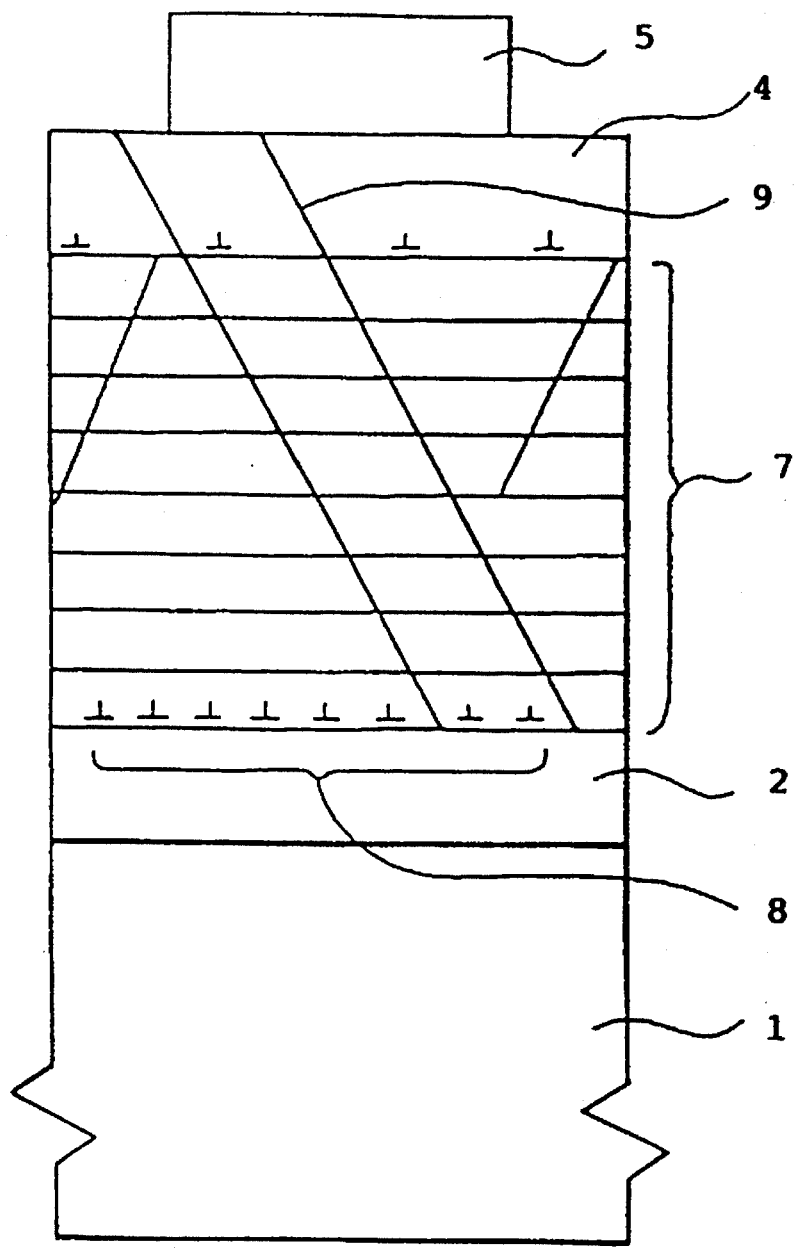
FIG. 7 is a cross sectional elevation view illustrative of the problems with the conventional ohmic contact using the n-type strained-layer superlattice on the n-type GaAs layer.

The above ohmic contact using either the InAs/GaAs or GaAs/GaSb strained-layer superlattice of p-type or n-type are also engaged with the following disadvantages which will be investigated with reference to FIG. 7.

As illustrated in FIG. 7, the GaAs/InAs strained-layer superlattice 7 is formed on the GaAs channel layer 2 overlying a semiconductor substrate 1. The InAs layer 4 overlays the GaAs/InAs strained-layer superlattice 7. The metal contact 5 is formed on the InAs layer 4. As described above, the GaAs/InAs strained-layer superlattice 7 is grown by the molecular beam epitaxy. In this case, the growth of the superlattice 7 by the molecular beam epitaxy is free from such difficulty as those in the precise and continuous control of the flux intensity of molecular beams. Namely, the growth of for the superlattice 7 is made simpler as compared to the growing process for the compositionally graded layer.

Figure 8:
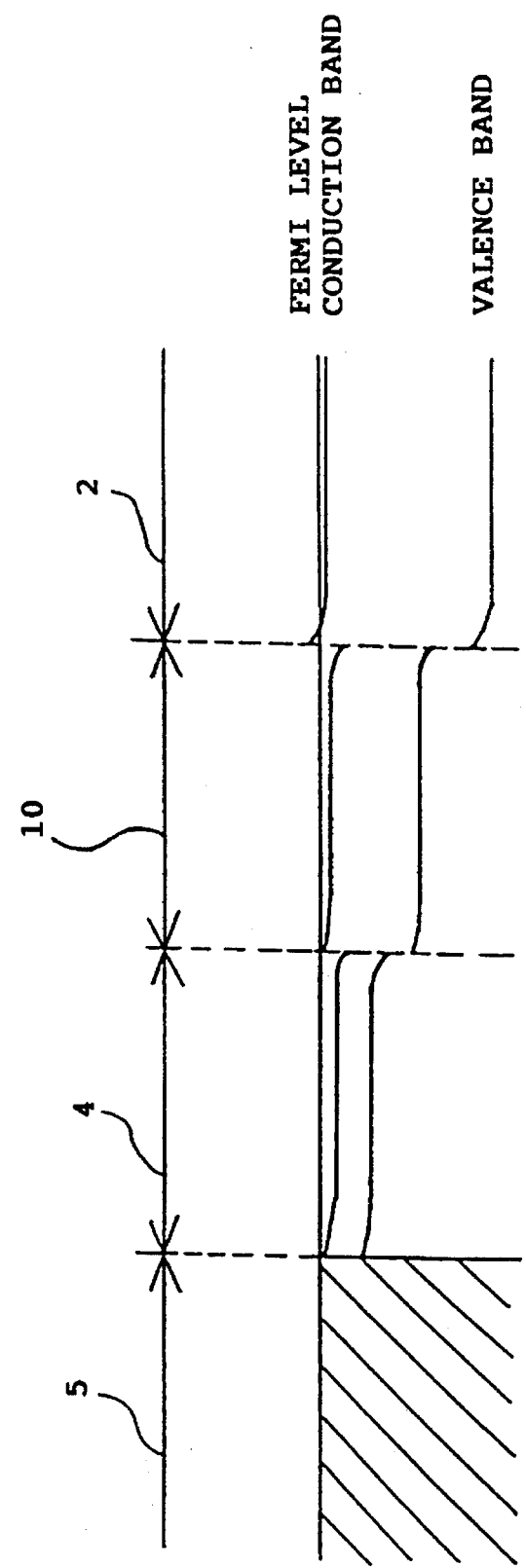
FIG. 8 is a diagram illustrative of energy band profiles of the conventional ohmic contact using the n-type composition non-graded layer on the n-type GaAs layer.

According to the Heisenberg's uncertainty principle, it is impossible to specify a precise position of electrons or holes. The electron's position may thus be represented as a wave function of carriers and thus electrons and holes. The superlattice 7 has such a short period of the potential well and the potential barrier as to allow the tunneling through the superlattice. Actually, such short period of the superlattice 7 is generally smaller than a wave length of electrons. Such short period of the superlattice 7 also has respective width constancies of the potential barriers and potential wells. Although the carriers and thus electrons or holes experience a nearly zero potential barrier but only within the superlattice structure, the carriers and thus electrons or holes experience a relatively large potential barrier both at the interface between the superlattice structure 7 and the GaAs channel layer 2 and at the interface between the superlattice structure and the InAs layer. Physically, the carriers and thus electrons or holes experience such a conduction band profile across the interfaces as that illustrated in FIG. 8 rather than the conduction band profile illustrated in FIG. 2. In this case, the effective energy band profile experienced by electrons is near an energy band profile as illustrated in FIG. 8 across the n-type GaAs layer 2 underlying an n-type In 0.5 Ga 0.5 As layer 10 underlying the n-type InAs layer 4 underlying the metal contact 5. The constancy of such short periodical superlattice provides the discontinuity in the conduction band at the superlattice structure. This results in an enlargement of the contact resistance.

Further, the ohmic contact using the superlattice structure has other problems both in the misfit dislocation and in the stacking faults due to the lattice mismatch. A lattice constant of InAs is larger by 7% than a lattice constant of GaAs. Such lattice mismatch causes the misfit dislocations and the stacking faults.

Such misfit dislocation and stacking faults due to the lattice mismatch also appear near the interface between the GaAs/InAs superlattice structure and the GaAs, and near the interface between the GaAs/InAs superlattice structure and the InAs layer. Such misfit dislocation and stacking faults form space charge regions thereabout. The space charge region due to a high density of the misfit dislocation and the stacking faults near the interface results in a large internal resistance.

Of course, the p-type GaAs/InAs superlattice also has the above mentioned problems. Further, a difference in the lattice constants between GaAs and GaSb is 8%. Such lattice mismatch causes the above problems.

It is therefore required to provide a novel ohmic contact structure on a compound semiconductor layer for a semiconductor device.

SUMMARY OF THE INVENTION

Accordingly, it is a primary object of the present invention to provide a novel ohmic contact structure on a compound semiconductor layer.

It is a further object of the present invention to provide a novel ohmic contact on a compound semiconductor layer, which has an extremely low contact resistance.

It is a still further object of the present invention to provide a novel ohmic contact on a compound semiconductor layer, which is completely free from any potential barrier.

It is another object of the present invention to provide a novel ohmic contact on a compound semiconductor layer, which allows for less stringent control requirements.

The above and other objects, features and advantages of the present invention will be apparent from the following descriptions.

The present invention provides a novel ohmic contact device which comprises a metal layer and a strained-layer superlattice structure in contact with the metal layer. The strained-layer superlattice structure comprises a plurality of alternating laminations of first compound semiconductor strained layers having a first energy band gap and second compound semiconductor strained layers having a second energy band gap smaller than the first energy band gap. The first compound semiconductor strained layers have various thicknesses decreasing in a direction toward the metal layer. The second compound semiconductor strained layers have various thicknesses increasing in the direction toward the metal layer. The strained-layer superlattice structure is grown to have a sufficiently short period for permitting carriers, electrons or holes, in passing through the strained-layer superlattice structure, to experience substantially smooth and continuous potential profile like in alloy material and experience substantially no potential barriers nor potential wells, including miniband or minigap, to thereby permit the strained-layer superlattice structure to perform as a superlattice alloy-like material.

BRIEF DESCRIPTION OF THE DRAWINGS

Preferred embodiments of the present invention will hereinafter fully be described in detail with reference to the accompanying drawings.

FIG. 1 is a diagram illustrative of energy band profiles of the conventional ohmic contact using the n-type compositionally graded layer on the n-type GaAs layer.

FIG. 2 is a diagram illustrative of energy band profiles of the conventional ohmic contact using the n-type strained-layer superlattice on the n-type GaAs layer.

FIG. 3 is a diagram illustrative of energy band profiles of the conventional ohmic contact using the p-type compositionally graded layer on the p-type GaAs layer.

FIG. 4 is a diagram illustrative of energy band profiles of the conventional ohmic contact using the p-type strained-layer superlattice on the p-type GaAs layer.

FIG. 5 is a diagram illustrative of energy band profiles of the conventional ohmic contact using the p-type compositionally graded layer on the p-type GaAs layer.

FIG. 6 is a diagram illustrative of energy band profiles of the conventional ohmic contact using the p-type strained-layer superlattice on the p-type GaAs layer.

FIG. 7 is a cross sectional elevation view illustrative of the problems with the conventional ohmic contact using the n-type strained-layer superlattice on the n-type GaAs layer.

FIG. 8 is a diagram illustrative of energy band profiles of the conventional ohmic contact using the n-type non-compositionally graded layer on the n-type GaAs layer.

Figure 9:
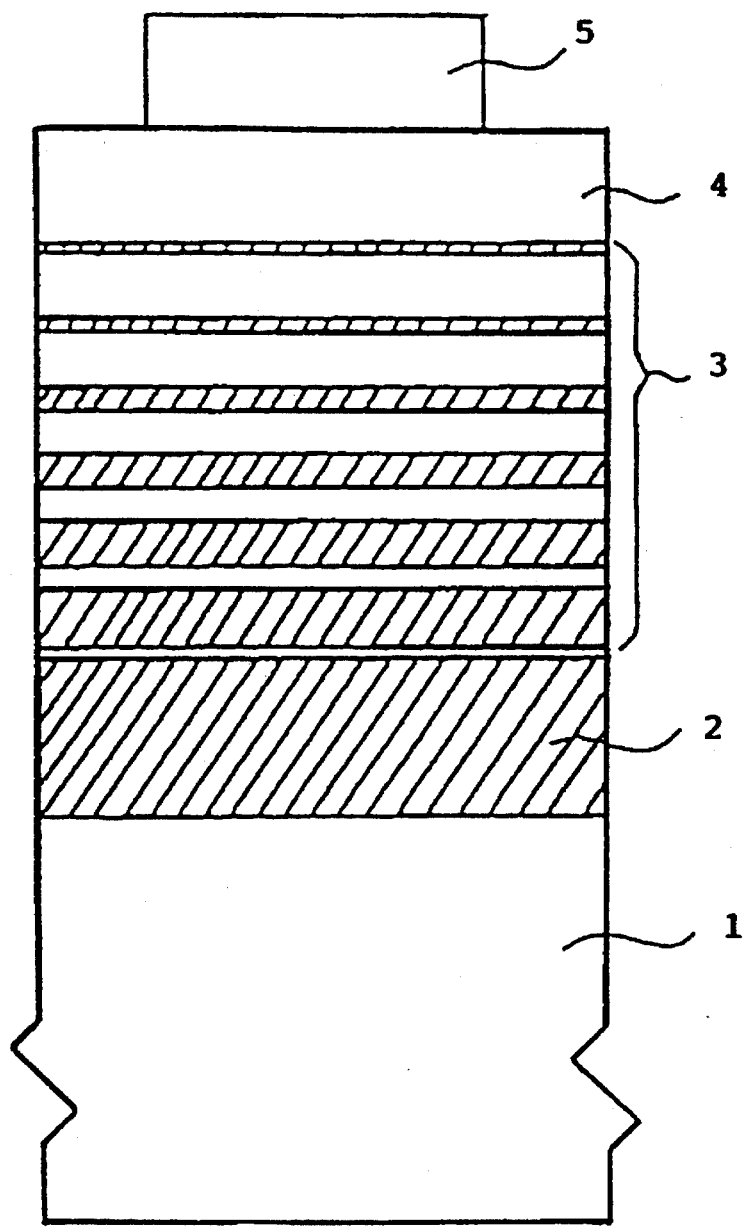
FIG. 9 is a cross sectional elevation view illustrative of a novel ohmic contact using n-GaAs/n-InAs modulation-period superlattice of a first embodiment according to the present invention.

FIG. 9 is a cross sectional elevation view illustrative of a novel ohmic contact using p-GaAs/InAs modulation-period superlattice of a first embodiment according to the present invention.

FIG. 10 is a diagram illustrative of energy band profiles of a novel ohmic contact using n-GaAs/n-InAs modulation-period superlattice of a first embodiment according to the present invention.

FIG. 11 is a diagram illustrative of energy band profiles of a novel ohmic contact using p-GaAs/p-InAs modulation-period superlattice of a second embodiment according to the present invention.

FIG. 12 is a diagram illustrative of energy band profiles of a novel ohmic contact using p-GaAs/p-InAs modulation-period superlattice of a third embodiment according to the present invention.

PREFERRED EMBODIMENTS OF THE INVENTION

The present invention provides a novel non-alloyed ohmic contact on a compound semiconductor layer. The novel non-alloyed ohmic contact includes a modulation-period superlattice structure which provides an extremely low contact resistance.

The present invention provides a low resistive compound semiconductor multilayer structure which comprises a first layer made of a first compound semiconductor having a first energy band gap, a superlattice in contact with the first layer, and a second layer made of the second compound semiconductor in contact with the superlattice. The superlattice has modulation-periods comprising alternating first very thin layers made of the first compound semiconductor and second very thin layer made of a second compound semiconductor having a second energy band gap being smaller than the first energy band gap. Thicknesses of the first very thin layers are gradually reduced from an interface of the first layer to an opposite interface. Thicknesses of the second very thin layers are gradually increased from the interface of the first layer to the opposite interface.

A first embodiment of the present invention will be described with reference to FIGS. 9 and 10.

A novel ohmic contact is formed on a GaAs compound semiconductor substrate 1. A layer 2 of GaAs doped with an n-type dopant is formed on the GaAs substrate 1. A superlattice structure 3 which comprises modulation-periods of alternating n-type GaAs/InAs layers is grown on the n-type GaAs layer 2 by molecular beam epitaxy. A layer 4 of InAs doped with an n-type dopant is formed on the n-type GaAs/InAs modulation-period superlattice structure 3. A metal contact 5 is formed on the n-type InAs layer 4.

As described the above, the n-type GaAs/InAs modulated-period superlattice structure 3 comprises the modulated period of alternating the n-type GaAs layer and the n-type InAs layer. In the modulation-period superlattice 3, widths of the plural GaAs layers are so modulated as to be gradually reduced from 4 nanometers at an interface to the n-type GaAs layer 2 to 0.3 nanometers at an interface to the n-type InAs layer 4. In contrast, widths of the plural InAs layers are so modulated as to be gradually enlarged from 0.3 nanometers at the interface to the n-type GaAs layer 2 to 4 nanometers at the interface to the n-type InAs layer 4. Namely, the average composition of GaAs is gradually reduced from the n-type GaAs layer 2 to the n-type InAs layer 4. The average composition of InAs is gradually enlarged from the n-type GaAs layer 2 to the n-type InAs layer 4. Such modulation-period superlattice 3 has a total thickness of 50 nanometers. The n-type InAs layer 4 (not shown to scale in FIG. 9) has a thickness of 50 nanometers.

With respect to the doping level of the layers, the n-type GaAs layer 2 has a dopant concentration of $2 \times 10^{18}$ cm$^{-3}$. The n-type InAs layer 4 has a high dopant concentration of $2 \times 10^{19}$ cm$^{-3}$. The n-type GaAs/InAs modulation-period superlattice structure 3 is subjected to such a modulation-doping as to have the dopant concentration exhibit a gradual increase from the dopant concentration of $2 \times 10^{18}$ cm$^{-3}$ at the interface with the n-type GaAs layer 2 to the high dopant concentration of $2 \times 10^{19}$ cm$^{-3}$ at the interface with the n-type InAs layer 4.

The metal contact 5 (simplified in FIG. 9 as one layer not shown to scale) comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Properties of the ohmic contact including the n-type modulation-period superlattice to the n-type compound semiconductor layer of the first embodiment according to the present invention will be investigated with reference to FIG. 10 which is illustrative of an energy band profile across the interfaces of the each layer.

With respect to the n-type GaAs layer 2, the conduction band edge exists below the Fermi level. Thus, the energy band gap also exists below the Fermi level.

With respect to the n-type InAs layer 4, the conduction band edge exists below the Fermi level. Thus, the energy band gap also exists below the Fermi level.

With respect to the n-type modulation-period superlattice 3, the n-type GaAs layers provide potential barriers. The n-type InAs layers provide potential wells. Each of the GaAs/InAs layers is so thin that electrons serving as carriers are able to exhibit tunneling through a potential barrier. The widths of the potential wells are gradually increased from 0.3 nanometers at the interface with the n-type GaAs layer 2 to 4 nanometers at the interface with the n-type InAs layer 4. Contrary to the potential well widths, the widths of the potential barriers are gradually reduced from 4 nanometers at the interface with the n-type GaAs layer 2 to 0.3 nanometers at the interface with the n-type InAs layer 4. In each of the potential wells, a plurality of sub-bands or mini-bands separated by the mini-band gaps exist. Electrons are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the n-type GaAs layer 2, the sub-band energy levels available for electrons are limited. This does not allow many electrons to exist in the potential well, particularly at a deep point in the potential well. In contrast, in the vicinity of the interface to the n-type InAs layer 4, the sub-band energy levels available for electrons are not limited relatively. This allows many electrons to exist in the potential well.

In the vicinity of the interface to the n-type GaAs layer 2, available energy levels for electrons are near to those in the n-type GaAs layer 2. In the vicinity of the interface to the n-type InAs layer 4, available energy levels for electrons are near to those in the n-type InAs layer 4. Electrons effectively experience such a smooth potential start profile as that provided by a compositionally graded layer. The effective potential profile experienced by electrons is completely free from any barrier due to the conduction band discontinuity. Accordingly, electrons will experience no potential barrier not only in the modulation-period superlattice 3 but also at the interface to either the n-type GaAs layer 2 or the n-type InAs layer 4. Such modulation-period superlattice 3 provides an extremely low resistance ohmic contact to the n-type GaAs compound semiconductor layer 2.

On the other hand, as described above, the modulation-period superlattice 3 is grown by molecular beam epitaxy. The growing process for the modulation-period superlattice 3 is free from the necessity for continuous and precise control of the flux intensity of molecular beams of In and Ga. This simplifies the growth of the modulation-period superlattice 3. In the modulation-period superlattice 3, as described above, the widths of the plural GaAs layers are so modulated as to be gradually reduced from the interface with the n-type GaAs layer 2 to the interface with the n-type InAs layer 4. The widths of the plural InAs layers are so modulated as to be gradually enlarged from the interface to the n-type GaAs layer 2 to the interface to the n-type InAs layer 4. Namely, the average composition of GaAs is gradually reduced from the n-type GaAs layer 2 to the n-type InAs layer 4. The average composition of InAs is gradually enlarged from the n-type GaAs layer 2 to the n-type InAs layer 4. The lattice constant is gradually increased from the n-type GaAs layer 2 to the n-type InAs layer 4. There exists no discontinuity in the lattice constant not only in the modulation-period superlattice 3 but also at the interfaces to the n-type GaAs layer 2 and the n-type InAs layer 4. There exists no misfit dislocation nor stacking faults concentrated in the interfaces in such modulation-period superlattice 3. Accordingly, such ohmic contact including the modulation-period superlattice 3 is free from the rise of the contact resistance due to the high density of the misfit dislocation or stacking fault. Such modulation-period superlattice 3 provides an extremely low resistance ohmic contact to the n-type GaAs compound semiconductor layer 2.

The value of the contact resistance of the ohmic contact employing the modulation-period superlattice will be investigated as compared to the contact resistances of the conventional ohmic contact.

In the prior arts, the conventional ohmic contact using the n-type InGaAs compositionally graded layer has a contact resistance of $8.6 \times 10^{-8}$ ohms/cm$^2$. Another types of the conventional ohmic contact using the n-type 2 nm/2 nm of GaAs/InAs compositionally graded layer has a contact resistance of $1.5 \times 10^{-6}$ ohms/cm$^2$.

In contrast, the novel ohmic contact employing the n-type GaAs/InAs modulation-period superlattice 3 on the n-type GaAs layer provided by the first embodiment has an extremely low contact resistance of less than $5.8 \times 10^{-8}$ ohms/cm$^2$.

Alternatively, the n-type InAs layer 4 is replaceable with an n-type InGaAs layer under the condition of a large compositional ratio of InAs to GaAs.

A second embodiment of the present invention will be described with reference to FIG. 11.

A novel ohmic contact is formed on a GaAs compound semiconductor substrate. A layer 2' of GaAs doped with a p-type dopant is formed on the GaAs substrate. A superlattice structure 3' which comprises modulation-periods of alternating p-type GaAs/InAs layers is grown on the p-type GaAs layer 2 by molecular beam epitaxy. A layer 4' of InAs doped with a p-type dopant is formed on the p-type GaAs/InAs modulation-period superlattice structure 3'. A metal contact 5 is formed on the p-type InAs layer 4'.

As described above, the p-type GaAs/InAs modulation-period superlattice structure 3' comprises the modulation-periods of alternating the p-type GaAs layer and the p-type InAs layer. In the modulation-period superlattice 3', widths of the plural GaAs layers are so modulated as to be gradually reduced from 4 nanometers at an interface to the p-type GaAs layer 2' to 0.3 nanometers at an interface to the p-type InAs layer 4'. In contrast, widths of the plural InAs layers are so modulated as to be gradually enlarged from 0.3 nanometers at the interface to the p-type GaAs layer 2' to 4 nanometers at the interface to the p-type InAs layer 4'. Namely, the average composition of GaAs is gradually reduced from the p-type GaAs layer 2' to the p-type InAs layer 4'. The average composition of InAs is gradually enlarged from the p-type GaAs layer 2' to the p-type InAs layer 4'. Such modulation-period superlattice 3' has a total thickness of 50 nanometers. The p-type InAs layer 4' has a thickness of 50 nanometers.

With respect to the doping level of the layers, the p-type GaAs layer 2' has a dopant concentration of $2 \times 10^{18}$ cm$^{-3}$. The p-type InAs layer 4' has a high dopant concentration of $2 \times 10^{19}$ cm$^{-3}$. The p-type GaAs/InAs modulation-period superlattice structure 3' is subjected to such a modulation-doping as to have the dopant concentration exhibit a gradual increase from the dopant concentration of $2 \times 10^{18}$ cm$^{-3}$ at the interface with the p-type GaAs layer 2' to the high dopant concentration of $2 \times 10^{19}$ cm$^{-3}$ at the interface with the p-type InAs layer 4'.

The metal contact 5 (simplified as layer 5 in FIG. 11) comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Properties of the ohmic contact including the p-type modulation-period superlattice to the p-type compound semiconductor layer of the second embodiment according to the present invention will be investigated with reference to FIG. 11 which is illustrative of an energy band profile across the interfaces of each layer.

With respect to the p-type GaAs layer 2', the valence band edge exists below but in the vicinity of the Fermi level. The Fermi level exists within the energy band gap but near the valence band edge.

With respect to the p-type InAs layer 4', the valance band edge exists above the Fermi level. The energy band gap also exists above the Fermi level.

With respect to the p-type modulation-period superlattice 3', the p-type GaAs layers provide potential barriers. The p-type InAs layers provide potential wells. Each of the GaAs/InAs layers is so thin that holes serving as carriers are able to exhibit the tunneling through a potential barrier. The widths of the potential wells are gradually increased from 0.3 nanometers at the interface with the p-type GaAs layer 2' to 4 nanometers at the interface with the p-type InAs layer 4'. Contrary to the potential well widths, the widths of the potential barriers are gradually reduced from 4 nanometers at the interface with the p-type GaAs layer 2' to 0.3 nanometers at the interface with the p-type InAs layer 4'. In each of the potential wells, a plurality of sub-bands or mini-bands separated by the mini-band gaps exist. Holes are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the p-type GaAs layer 2', the sub-band energy levels available for holes are limited. This does not allow many holes to exist in the potential well, particularly at a deep point in the potential well. In contrast, in the vicinity of the interface to the p-type InAs layer 4', the sub-band energy levels available for holes are not limited relatively. This allows many holes to exist in the potential well.

In the vicinity of the interface to the p-type GaAs layer 2', available energy levels for holes are near to those in the p-type GaAs layer 2'. In the vicinity of the interface to the p-type InAs layer 4', available energy levels for holes are near to those in the p-type InAs layer 4'. Holes effectively experience such a smooth potential profile as that provided by a compositionally graded layer. The effective potential profile experienced by holes is completely free from any barrier due to the valence band discontinuity. Accordingly, holes will experience no potential barrier not only in the modulation-period superlattice 3' but also at the interface to either the p-type GaAs layer 2' or the p-type InAs layer 4'. Such modulation-period superlattice 3' provides an extremely low resistance ohmic contact to the p-type GaAs compound semiconductor layer 2'.

On the other hand, as described above, the modulation-period superlattice 3' is grown by molecular beam epitaxy. The growth of the modulation-period superlattice 3' is free from the necessity for the continuous and precise control of the flux intensity of molecular beams of In and Ga. This simplifies the growth of the modulation-period superlattice 3'. In the modulation-period superlattice 3', as described above, the widths of the plural GaAs layers are so modulated as to be gradually reduced from the interface with the p-type GaAs layer 2' to the interface with the p-type InAs layer 4'. The widths of the plural InAs layers are so modulated as to be gradually enlarged from the interface to the p-type GaAs layer 2' to the interface to the p-type InAs layer 4'. Namely, the average composition of GaAs is gradually reduced from the p-type GaAs layer 2' to the p-type InAs layer 4'. The average composition of InAs is gradually enlarged from the p-type GaAs layer 2' to the p-type InAs layer 4'. The lattice constant is gradually increased from the p-type GaAs layer 2' to the p-type InAs layer 4'. There exists no discontinuity in the lattice constant not only in the modulation-period superlattice 3' but also at the interfaces to the p-type GaAs layer 2' and the p-type InAs layer 4'. There exists no misfit dislocation nor stacking faults concentrated at the interfaces in such modulation-period superlattice 3'. Accordingly, such ohmic contact including the modulation-period superlattice 3' is free from the rise of the contact resistance due to the high density of the misfit dislocation or stacking faults. Such modulation-period superlattice 3' provides an extremely low resistance ohmic contact to the p-type GaAs compound semiconductor layer 2'.

The value of the contact resistance of the ohmic contact employing the modulation-period superlattice will be investigated.

Indeed, the novel ohmic contact employing the p-type GaAs/InAs modulation-period superlattice 3' on the p-type GaAs layer provided by the second embodiment has an extremely low contact resistance of less than $1 \times 10^{-6}$ ohms/cm$^2$.

A third embodiment of the present invention will be described with reference to FIG. 12.

A structure of a novel ohmic contact on a compound semiconductor layer of the third embodiment will be described.

A novel ohmic contact is formed on a GaAs compound semiconductor substrate. A layer 2' of GaAs doped with a p-type dopant is formed on the GaAs substrate. A superlattice structure 3" which comprises modulation-periods of alternating p-type GaAs/GaSb layers is grown on the p-type GaAs layer 2' by molecular beam epitaxy. A layer 4" of GaSb doped with an p-type dopant is formed on the p-type GaAs/GaSb modulation-period superlattice structure 3". A metal contact 5 is formed on the p-type GaSb layer 4".

As described above, the p-type GaAs/GaSb modulation-period superlattice structure 3" comprises the modulation-periods of alternating the p-type GaAs layer and the p-type GaSb layer. In the modulation-period superlattice 3', widths of the plural GaAs layers are so modulated as to be gradually reduced from 4 nanometers at an interface to the p-type GaAs layer 2' to 0.3 nanometers at an interface to the p-type GaSb layer 4". In contrast, widths of the plural GaSb layers are so modulated as to be gradually enlarged from 0.3 nanometers at the interface to the p-type GaAs layer 2' to 4 nanometers at the interface to the p-type GaSb layer 4". Namely, the average composition of GaAs is gradually reduced from the p-type GaAs layer 2' to the p-type GaSb layer 4". The average composition of GaSb is gradually enlarged from the p-type GaAs layer 2' to the p-type GaSb layer 4". Such modulation-period superlattice 3" has a total thickness of 50 nanometers. The p-type GaSb layer 4" has a thickness of 50 nanometers.

With respect to the doping level of the each layers, the p-type GaAs layer 2' has a dopant concentration of $2 \times 10^{18}$ cm$^{-3}$. The p-type GaSb layer 4" has a high dopant concentration of $2 \times 10^{19}$ cm$^{-3}$. The p-type GaAs/GaSb modulation-period superlattice structure 3" is subjected to such a modulation-doping as to have the dopant concentration exhibit a gradual increase from the dopant concentration of $2 \times 10^{18}$ cm$^{-3}$ at the interface with the p-type GaAs layer 2' to the high dopant concentration of $2 \times 10^{19}$ cm$^{-3}$ at the interface with the p-type GaSb layer 4".

The metal contact 5 (shown as one layer in FIG. 12) comprises a layer of Ti of a thickness of 50 nanometers, a layer of Pt of a thickness of 50 nanometers overlaying the Ti layer and a layer of Au of a thickness of 300 nanometers overlaying the Pt layer. The above Ti, Pt and Au layers are sequentially formed by a lift-off process using vacuum evaporation.

Properties of the ohmic contact including the p-type modulation-period superlattice to the p-type compound semiconductor layer of the third embodiment according to the present invention will be investigated with reference to FIG. 12 which is illustrative of an energy band profile across the interfaces of the each layer.

With respect to the p-type GaAs layer 2', the valence band edge exists below but in the vicinity of the Fermi level. The Fermi level exists within the energy band gap but near the valence band edge.

With respect to the p-type GaSb layer 4", the valance band edge exists above the Fermi level. The energy band gap also exists above the Fermi level.

With respect to the p-type modulation-period superlattice 3", the p-type GaAs layers provide potential barriers. The p-type GaSb layers provide potential wells. Each of the GaAs/GaSb layers is so thin that holes serving as carriers are able to exhibit the tunneling through a potential barrier. The widths of the potential wells are gradually increased from 0.3 nanometers at the interface with the p-type GaAs layer 2' to 4 nanometers at the interface with the p-type GaSb layer 4". Contrary to the potential well widths, the widths of the potential barriers are gradually reduced from 4 nanometers at the interface with the p-type GaAs layer 2' to 0.3 nanometers at the interface with the p-type GaSb layer 4". In each of the potential wells, a plurality of sub-bands or mini-bands separated by the mini-band gaps exist. Holes are allowed to take only specified energy levels defined by plural sub-bands separated by the band gaps in the potential well. The sub-band energy levels are associated with the width of the potential well. A small width of the potential well does not allow the sub-band energy level at a deep point in the potential well. In contrast, a large width of the potential well allows the sub-band energy level at a deep point in the potential well. The widths of the sub-bands in the potential well are defined by a width of the potential barrier. The reduction of the width of the potential barrier makes the widths of the sub-bands enlarged. In the vicinity of the interface to the p-type GaAs layer 2', the sub-band energy levels available for holes are limited. This does not allow many holes to exist in the potential well, particularly at a deep point in the potential well. In contrast, in the vicinity of the interface to the p-type GaSb layer 4", the sub-band energy levels available for holes are not limited relatively. This allows many holes to exist in the potential well.

In the vicinity of the interface to the p-type GaAs layer 2', available energy levels for holes are near to those in the p-type GaAs layer 2'. In the vicinity of the interface to the p-type GaSb layer 4", available energy levels for holes are near to those in the p-type GaSb layer 4". Holes effectively experience such a smooth potential profile as that provided by a compositionally graded layer. The effective potential profile experienced by holes is completely free from any barrier due to the valence band discontinuity. Accordingly, holes will experience no potential barrier not only in the modulation-period superlattice 3" but also at the interface to either the p-type GaAs layer 2' or the p-type GaSb layer 4". Such modulation-period superlattice 3" provides an extremely low resistance ohmic contact to the p-type GaAs compound semiconductor layer 2'.

On the other hand, as described above, the modulation-period superlattice 3" is grown by molecular beam epitaxy. The growing process for the modulation-period superlattice 3" is free from the necessity for the continuous and precise control of the flux intensity of molecular beams of As and Sb. This simplifies the growth process for the modulation-period superlattice 3". In the modulation-period superlattice 3", as described the above, the widths of the plural GaAs layers are so modulated as to be gradually reduced from the interface with the p-type GaAs layer 2' to the interface with the p-type GaSb layer 4". The widths of the plural InAs layers are so modulated as to be gradually enlarged from the interface to the p-type GaAs layer 2' to the interface to the p-type GaSb layer 4". Namely, the average composition of GaAs is gradually reduced from the p-type GaAs layer 2' to the p-type GaSb layer 4". The average composition of the GaSb is gradually enlarged from the p-type GaAs layer 2' to the p-type GaSb layer 4". The lattice constant is gradually increased from the p-type GaAs layer 2' to the p-type GaSb layer 4". There exists no discontinuity in the lattice constant not only in the modulation-period superlattice 3" but also at the interfaces to the p-type GaAs layer 2' and the p-type GaSb layer 4". There exists no misfit dislocation nor stacking faults concentrated at the interfaces in such modulation-period superlattice 3". Accordingly, such ohmic contact including the modulation-period superlattice 3" is free from the rise of the contact resistance due to the high density of the misfit dislocation or stacking fault. Such modulation-period superlattice 3" provides an extremely low resistance ohmic contact to the p-type GaAs compound semiconductor layer 2'.

The value of the contact resistance of the ohmic contact employing the modulation-period superlattice will be investigated.

Indeed, the novel ohmic contact employing the p-type GaAs/GaSb modulation-period superlattice 3" on the p-type GaAs layer provided by the second embodiment has an extremely low contact resistance of less than $1 \times 10^{-7}$ ohms/$cm^2$.

As a modification of the metal contact, although in the above embodiments, the metal contact 5 comprises the Ti/Pt/Au layers, other metals such as tungsten silicide are also available as a material for the metal contact.

The thickness and doping level of each of the layers may be so modified as to match variable conditions.

Such desirable ohmic contacts provided by the above embodiments are of course applicable to contacts of electrical and optical devices, particularly high speed and high frequency heterostructure transistors such as the high electron mobility transistor (HEMT) and the heterojunction bipolar transistor (HBT). Such extremely low resistance ohmic contact provided by the embodiments allows the electrical and optical devices to exhibit excellent performances such as high speed and high frequency performances.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the sprit and scope of the invention.

What is claimed is:

1. A low resistance metal-semiconductor ohmic contact multi-layer structure comprising:

an n-GaAs layer;

a modulated-period, strain-layered superlattice structure disclosed on said n-GaAs layer;

an n-InGaAs layer having a large ratio of InAs to Ga and disposed on said modulated-period, strain-layered superlattice structure; and a metal layer disposed on said n-InGaAs layer;

wherein said modulated-period, strain-layered superlattice structure comprises:

a plurality of alternating lamination of n-GaAs strained layers having a first energy band gap and n-InAs strained layers having a second energy band gap smaller than first energy band gap, said n-GaAs strained layers having various thicknesses decreasing in a direction toward said metal layer, said n-InAs strained layers having various thicknesses increasing in said direction;

wherein a ratio of said thicknesses of said n-GaAs and n-InAs strained layers is varied to substantially eliminate discontinuities in the lattice constant at the interfaces between said n-GaAs and n-InAs strained-layers, and at the interfaces between said superlattice structure and said n-InGaAs and between said superlattice structure and said n-GaAs layer;

wherein said strained-layer superlattice structure has a modulated period of a short duration so as to exhibit a substantially smooth and continuous potential profile and substantially no potential barriers nor potential wells, to thereby permit said strained-layer superlattice structure to perform as a superlattice alloy-like material; and wherein said n-GaAs and n-InAs strained layers are so doped that said strained-layer superlattice structure has an impurity concentration profile in which said impurity concentration is graded from $2\times10^{18}$ cm$^{-3}$ to $2\times10^{19}$ cm$^{-3}$ in said direction toward said metal layer so that said metal-semiconductor ohmic contact has a resistance of less than $5.8\times10^{-8}$ ohms/cm$^2$.

2. An ohmic electrode comprising:

a metal contact;

a p-InGaAs layer having a large ratio of InAs to Ga and being in contact with said metal contact;

a strained-layer superlattice layer being in contact with said p-InGaAs layer; and a p-InAs layer being in contact with said strained-layer superlattice layer;

wherein said strained-layer superlattice layer comprises:
  a plurality of alternating lamination of p-GaAs strained layers having a first energy band gap and p-InAs strained layers having a second energy band gap, said p-GaAs strained layers having various thicknesses decreasing from approximately 4 nanometers to approximately 0.3 nanometers in a direction toward said metal contact, said p-InAs strained layers having various thicknesses increasing from approximately 0.3 nanometers to approximately 4 nanometers in said direction;
  wherein a ratio of said thicknesses of said p-GaAs and p-InAs strained layers is varied to substantially eliminate discontinuities in the lattice constant at the interfaces between the p-GaAs and p-InAs strained layers and at the interfaces between said superlattice structure and said p-InGaAs layer and between said superlattice structure and said p-InAs layer;
  wherein said strained-layer superlattice structure has a modulated period of a short duration sufficiently smaller than the wavelengths of the carriers so as to exhibit a substantially smooth and continuous potential profile and substantially no potential barriers nor potential wells, to thereby permit said strained layer superlattice structure to perform as a superlattice alloy-like material; and
  wherein said p-GaAs and p-InAs strained layers are so doped that said strained-layer superlattice structure has an impurity concentration profile in which said impurity concentration is graded from $2\times10^{18}$ cm$^{-3}$ to $2\times10^{19}$ cm$^{-3}$ in said direction toward said metal layer so that said metal-semiconductor ohmic contact has a resistance of less than $1\times10^{-6}$ ohms/cm$^2$.

3. An ohmic electrode comprising:

a metal contact;

a p-GaAsSb layer having a large ratio of GaSb to As and being in contact with said metal contact;

a strained-layer superlattice layer having a thickness of approximately 50 nanometers and being in contact with said p-GaAsSb layer; and a p-GaAs layer being in contact with said strained-layer superlattice layer;

wherein said strained-layer superlattice layer comprises:
  a plurality of alternating lamination of p-GaAs strained layers having a first energy band gap and p-GaSb strained layers having a second energy band gap, said p-GaAs strained layers having various thicknesses decreasing from approximately 4 nanometers to approximately 0.3 nanometers in a direction toward said metal contact, said p-GaSb strained layers having various thicknesses increasing from approximately 0.3 nanometers to approximately 4 nanometers in said direction;
  wherein a ratio of said thicknesses of said p-GaAs and p-GaSb strained layers is varied to substantially eliminate discontinuities in the lattice constant at the interfaces between said p-GaAs and p-GaSb strained layers and at the interfaces between said superlattice structure and said p-GaAsSb layer and between said superlattice structure and said p-GaAs layer;
  wherein said strained-layer superlattice structure has a modulated period of a short duration so as to exhibit a substantially smooth and continuous potential profile and substantially no potential barriers nor potential wells, to thereby permit said strained layer superlattice structure to perform as a superlattice alloy-like material; and
  wherein said p-GaAs and p-GaSb strained layers are so doped that said strained-layer superlattice structure has an impurity concentration profile in which said impurity concentration is graded from $2\times10^{18}$ cm$^{-3}$ to $2\times10\,10^{19}$ cm$^{-3}$ in said direction toward said metal layer so that said metal-semiconductor ohmic contact has a resistance of less than $1\times10^{-7}$ ohms/cm$^2$.

* * * * *